(12) United States Patent
Deen et al.

(10) Patent No.: US 11,876,092 B2
(45) Date of Patent: Jan. 16, 2024

(54) ION TRAP APPARATUS WITH INTEGRATED SWITCHING APPARATUS

(71) Applicant: Quantinuum LLC, Broomfield, CO (US)

(72) Inventors: David Deen, Golden Valley, MN (US); Grahame Vittorini, Golden Valley, MN (US); Nathaniel Burdick, Morris Plains, NJ (US)

(73) Assignee: Quantinuum LLC, Broomfield, CO (US)

( * ) Notice: Subject to any disclaimer, the term of this patent is extended or adjusted under 35 U.S.C. 154(b) by 299 days.

(21) Appl. No.: 17/305,201

(22) Filed: Jul. 1, 2021

(65) Prior Publication Data
US 2022/0037313 A1 Feb. 3, 2022

Related U.S. Application Data

(60) Provisional application No. 63/059,320, filed on Jul. 31, 2020.

(51) Int. Cl.
*H01L 27/06* (2006.01)
*H01L 29/94* (2006.01)
(Continued)

(52) U.S. Cl.
CPC ...... *H01L 27/0629* (2013.01); *H01L 29/7827* (2013.01); *H01L 29/945* (2013.01); *H03K 3/356017* (2013.01)

(58) Field of Classification Search
CPC .......... H01L 27/0629; H01L 29/7827; H01L 29/945; H01L 24/06; H01L 24/16;
(Continued)

(56) References Cited

U.S. PATENT DOCUMENTS

| 8,362,423 B1* | 1/2013 | Verdu Galiana | H01J 49/38 250/292 |
| 2016/0027604 A1* | 1/2016 | Cho | H01J 9/14 250/489 |

(Continued)

OTHER PUBLICATIONS

Dieng, et al. "Modeling and Frequency Performance Analysis of Through Silicon Capacitors in Silicon Interposers." IEEE Transactions on Components Packaging and Manufacturing Technology Part B, Institute of Electrical and Electronics Engineers (IEEE), 2017, 7 (4), pp. 477-484.

(Continued)

*Primary Examiner* — Shahed Ahmed
*Assistant Examiner* — Khatib A Rahman
(74) *Attorney, Agent, or Firm* — ALSTON & BIRD LLP

(57) ABSTRACT

An ion trap apparatus (e.g., ion trap chip) having a plurality of electrodes is provided. The ion trap apparatus may comprise a plurality of interconnect layers, a substrate, and at least one integrated switching network layer disposed between the plurality of interconnect layers and the substrate. The integrated switching network layer may comprise a plurality of monolithically-integrated controls and/or switches configured to condition a voltage signal applied to at least one of the plurality of electrodes. An example ion trap apparatus may comprise a surface ion trap chip. The ion trap apparatus may be configured to operate within a cryogenic chamber.

22 Claims, 11 Drawing Sheets

Figure 1A:
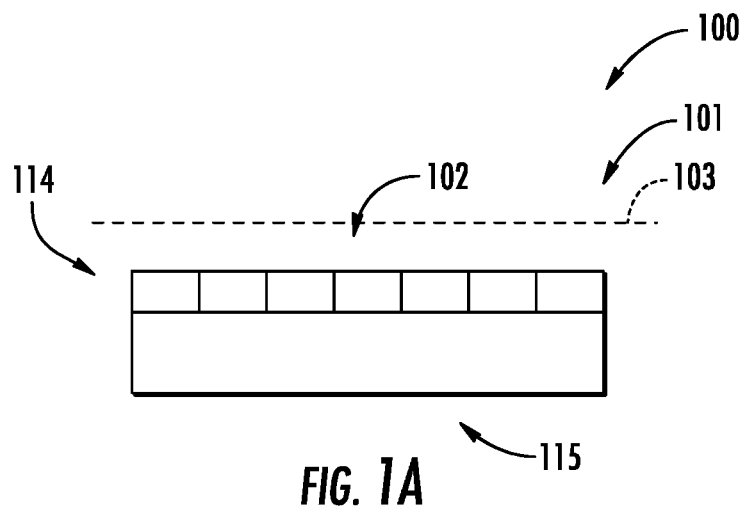

(51) Int. Cl.
*H01L 29/78* (2006.01)
*H03K 3/356* (2006.01)

(58) Field of Classification Search
CPC ........... H01L 24/48; H01L 2224/06181; H01L 2224/16227; H01L 2224/4824; H01L 2225/0651; H01L 2225/06517; H01L 2225/06541; H01L 2225/06572; H01L 2924/00014; H01L 25/0657; H01L 29/4236; H03K 3/356017; G06N 10/40; G06N 10/00; G21K 1/00
See application file for complete search history.

(56) References Cited

U.S. PATENT DOCUMENTS

| | | | | |
|---|---|---|---|---|
| 2016/0071715 A1* | 3/2016 | Anderson | ............. | H01J 49/062 315/111.81 |
| 2019/0027355 A1* | 1/2019 | Kim | ......................... | H01J 49/24 |
| 2021/0351135 A1* | 11/2021 | Or-Bach | ................. | H01L 25/16 |

OTHER PUBLICATIONS

Guiller, et al. "Through Silicon Capacitor co-integrated with TSV as an efficient 3D decoupling capacitor solution for power management on silicon interposer." 2014 IEEE 64th Electronic Components and Technology Conference (ECTC) (2014): 1296-1302.

Winkler, et al. "TSV Transistor—Vertical Metal Gate FET Inside a Through Silicon VIA," in IEEE Electron Device Letters, vol. 39, No. 10, pp. 1493-1496, Oct. 2018, doi: 10.1109/LED.2018.2864621.

Bruzewicz, Colin D., et al., "Trapped-ion quantum computing: Progress and challenges," May 29, 2019, Applied Physics Reviews, vol. 6, No. 031314, 46 pages, AIP Publishing, US.

Extended European search report dated Jun. 29, 2022 for EP Application No. 21186535, 9 pages.

Guise, Nicholas D., et al., "Ball-grid array architecture for microfabricated ion traps," Journal of Applied Physics, May 5, 2015, vol. 117, No. 174901, 10 pages, AIP Publishing LLC, US.

Stuart, J., et al., "Chip-integrated voltage sources for control of trapped ions," Oct. 17, 2018, Cornell University Archives, from the Internet at <arXiv:1810.07152v1>, 7 pages.

Zhao, Peng, et al., "Design, fabrication and characterization of surface electrode ion trap integrated with TSV," Proceedings of the 21st Electronics Packaging Technology Conference (EPTC '19), Singapore, Dec. 4-6, 2019, pp. 13-17, IEEE, US.

* cited by examiner

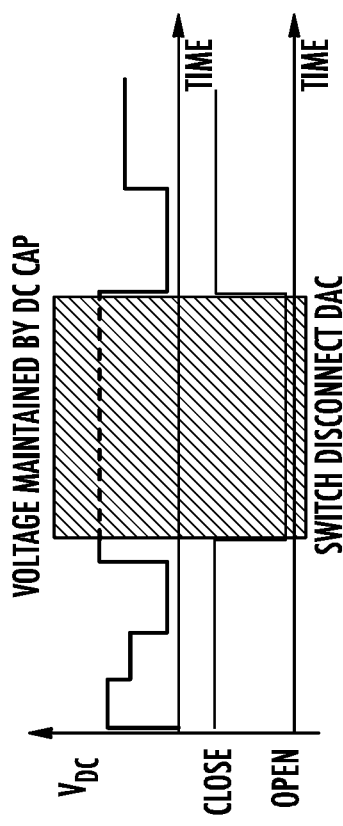
FIG. 7B
FIG. 7A
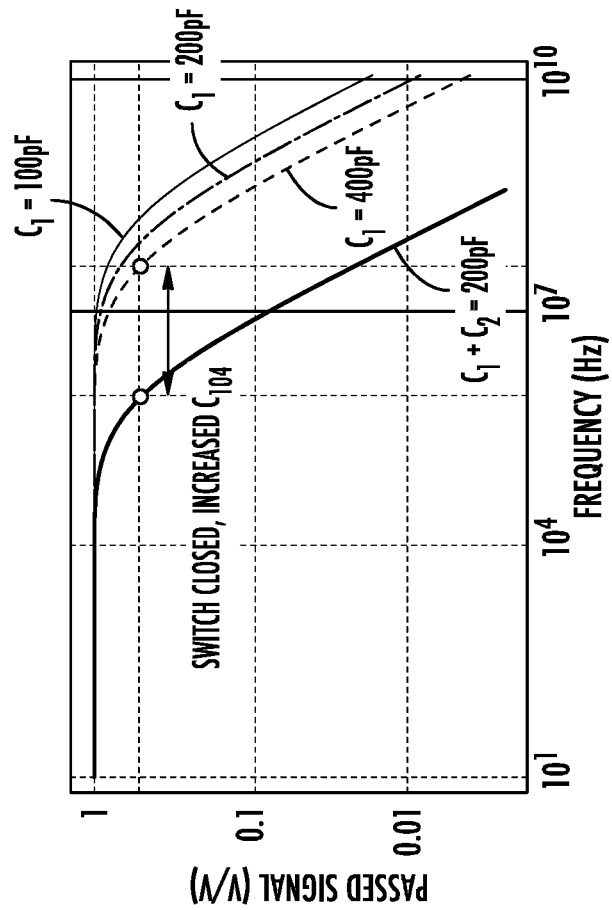
FIG. 8B
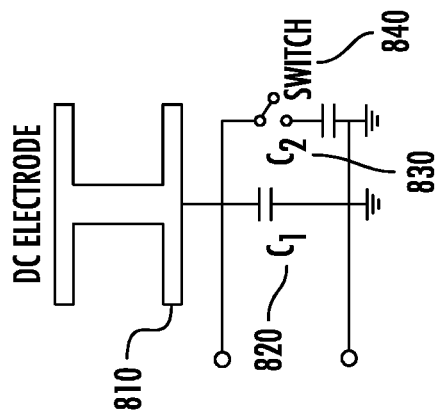
FIG. 8A

ION TRAP APPARATUS WITH INTEGRATED SWITCHING APPARATUS

CROSS-REFERENCE TO RELATED APPLICATIONS

This application claims priority to U.S. Application No. 63/059,320, filed Jul. 31, 2020, the content of which is incorporated herein by reference in its entirety.

TECHNICAL FIELD

Various embodiments relate to ion trap apparatuses with integrated switching apparatuses and/or controls.

BACKGROUND

An ion trap can use a combination of electrical and magnetic fields to capture one or more ions in a potential well. Ions can be trapped for a number of purposes, which may include mass spectrometry, research, and/or controlling quantum states of the trapped ions, for example. Through applied effort, ingenuity, and innovation many deficiencies of such prior ion traps have been solved by developing solutions that are structured in accordance with the embodiments of the present invention, many examples of which are described in detail herein.

BRIEF SUMMARY OF EXAMPLE EMBODIMENTS

Example embodiments provide ion trap apparatuses, quantum computers comprising ion trap apparatuses, quantum computer systems comprising ion trap apparatuses, and/or the like.

In an example embodiment, an ion trap chip having a plurality of electrodes is provided. The ion trap chip comprises a plurality of interconnect layers, a substrate, and an integrated switching network layer disposed between the plurality of interconnect layers and the substrate. The integrated switching network layer comprises a plurality of monolithically-integrated controls and/or switches configured to condition a voltage signal applied to at least one of the plurality of electrodes. The ion trap chip may comprise a surface ion trap chip. The ion trap chip may be configured to operate within a cryogenic chamber. At least some of the plurality of monolithically-integrated controls and/or switches may comprise one or more of bipolar junction transistors, metal-oxide-semiconductor field effect transistors, metal-semiconductor field-effect transistors, junction gate field-effect transistors, heterojunction bipolar transistors and high-electron-mobility transistors. At least some of the plurality of monolithically-integrated controls and/or switches may comprise field-effect transistors. At least some of the monolithically-integrated controls and/or switches may comprise through-silicon-via field effect transistors. At least some of the through-silicon-via field effect transistors may be configured as through-silicon-capacitors. At least some of the through-silicon-via field effect transistors may be configured as voltage-out-of-range switches. At least some of the through-silicon-via field effect transistors may be configured as disconnect switches.

In another example embodiment, an ion trap apparatus is provided. The ion trap apparatus comprises an ion trap chip having a plurality of electrodes, and an interposer chip coupled to the ion trap chip. The interposer chip comprises an integrated switching network layer. For example, in an example embodiment, the interposer chips defines at least a portion of an integrated switching network. The integrated switching network layer comprises a plurality of monolithically-integrated controls and/or switches configured to condition a voltage signal applied to at least one of the plurality of electrodes. The ion trap chip may comprise a surface ion trap chip. The ion trap apparatus may be configured to operate within a cryogenic chamber. At least some of the plurality of monolithically-integrated controls and/or switches may comprise one or more of bipolar junction transistors, metal-oxide-semiconductor field effect transistors, metal-semiconductor field-effect transistors, junction gate field-effect transistors, heterojunction bipolar transistors and high-electron-mobility transistors. At least some of the plurality of monolithically-integrated controls and/or switches may comprise field-effect transistors. At least some of the monolithically-integrated controls and/or switches may comprise through-silicon-via field effect transistors. At least some of the through-silicon-via field effect transistors may be configured as through-silicon-capacitors. At least some of the through-silicon-via field effect transistors may be configured as voltage-out-of-range switches. At least some of the through-silicon-via field effect transistors may be configured as disconnect switches.

In another example embodiment, an ion trap apparatus is provided. The ion trap apparatus comprises an ion trap chip having a plurality of electrodes, an interposer chip coupled to the ion trap chip, and an integrated switching network chip in communication with, connected to, and/or coupled to (e.g., physically coupled to and in communication with) the interposer chip. The integrated switching network chip comprises a plurality of monolithically-integrated controls and/or switches configured to condition a voltage signal applied to at least one of the plurality of electrodes. The integrated switching network chip may be connected to the interposer chip via an interconnect. The ion trap chip may comprise a surface ion trap chip. The ion trap apparatus may be configured to operate within a cryogenic chamber. At least some of the plurality of monolithically-integrated controls and/or switches may comprise one or more of bipolar junction transistors, metal-oxide-semiconductor field effect transistors, metal-semiconductor field-effect transistors, junction gate field-effect transistors, heterojunction bipolar transistors and high-electron-mobility transistors. At least some of the plurality of monolithically-integrated controls and/or switches may comprise field-effect transistors. At least some of the monolithically-integrated controls and/or switches may comprise through-silicon-via field effect transistors. At least some of the through-silicon-via field effect transistors may be configured as through-silicon-capacitors. At least some of the through-silicon-via field effect transistors may be configured as voltage-out-of-range switches. At least some of the through-silicon-via field effect transistors may be configured as disconnect switches.

In another example embodiment, an ion trap apparatus is provided. The ion trap apparatus comprises an ion trap chip having a plurality of electrodes and an interposer chip coupled to the ion trap chip. The ion trap apparatus comprises at least one integrated switching network layer coupled to the interposer chip and an integrated switching network chip in communication with, coupled and/or connected to the interposer chip. The at least one integrated switching layer and the integrated switching network chip each comprise a plurality of monolithically-integrated controls and/or switches configured to condition a voltage signal applied to at least one of the plurality of electrodes. The integrated switching network chip may be connected to the interposer chip via an interconnect. The ion trap chip may comprise a surface ion trap chip. The ion trap apparatus may be configured to operate within a cryogenic chamber. At least some of the plurality of monolithically-integrated controls and/or switches may comprise one or more of bipolar junction transistors, metal-oxide-semiconductor field effect transistors, metal-semiconductor field-effect transistors, junction gate field-effect transistors, heterojunction bipolar transistors and high-electron-mobility transistors. At least some of the plurality of monolithically-integrated controls and/or switches may comprise field-effect transistors. At least some of the monolithically-integrated controls and/or switches may comprise through-silicon-via field effect transistors. At least some of the through-silicon-via field effect transistors may be configured as through-silicon-capacitors. At least some of the through-silicon-via field effect transistors may be configured as voltage-out-of-range switches. At least some of the through-silicon-via field effect transistors may be configured as disconnect switches.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 1A provides a side view of the example ion trap apparatus, in accordance with an example embodiment.

Figure 1B:
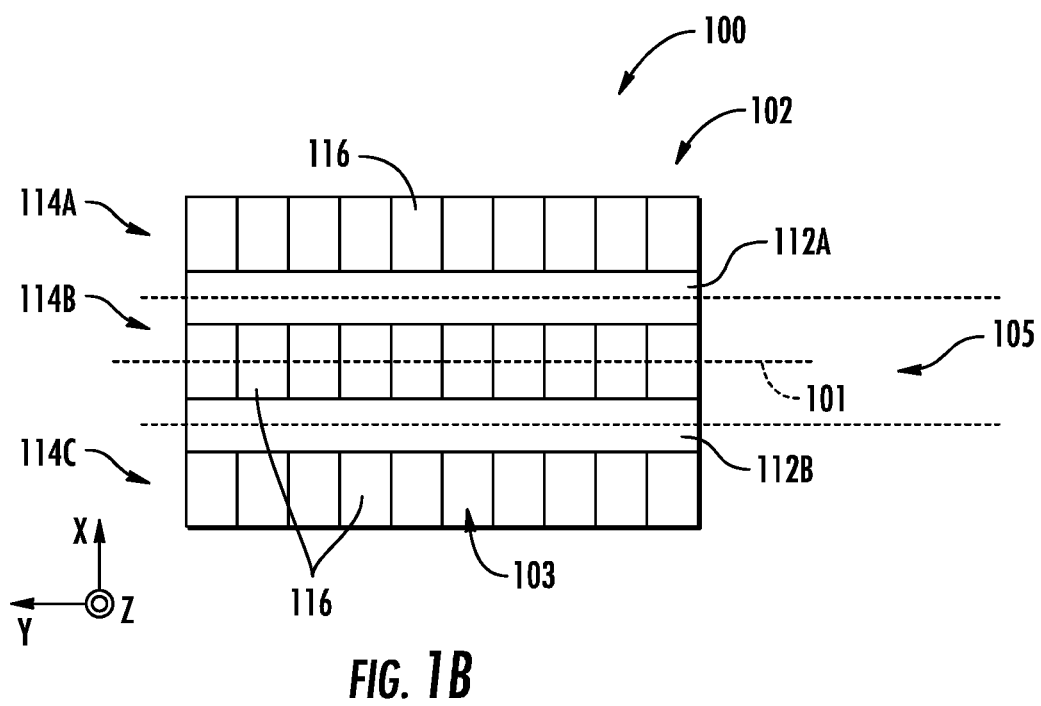

FIG. 1B provides a top view of the example ion trap apparatus of FIG. 1A, in accordance with an example embodiment.

Figure 2:
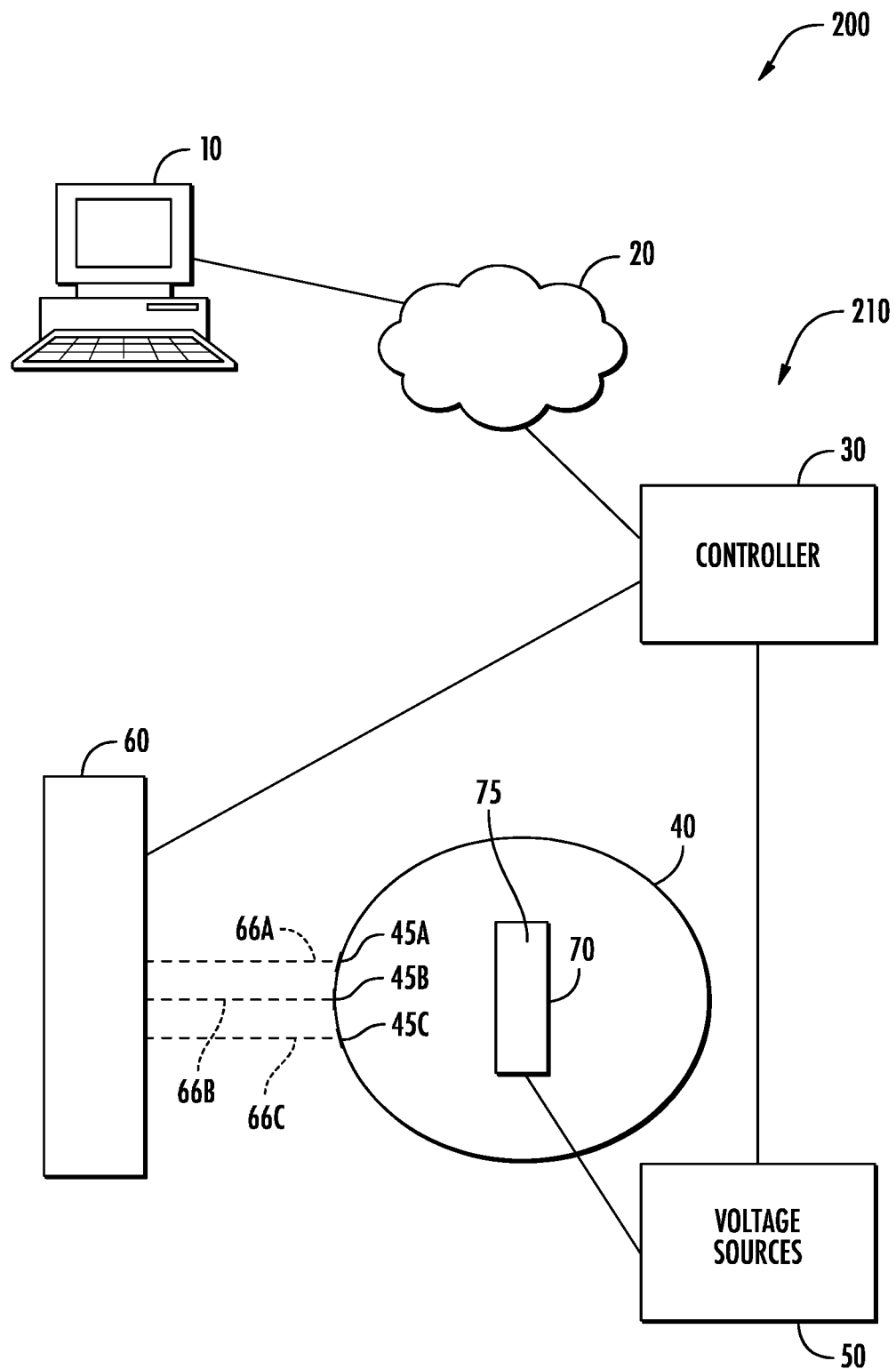

FIG. 2 provides a schematic diagram of a quantum computer comprising an ion trap apparatus, in accordance with an example embodiment.

Figure 3:
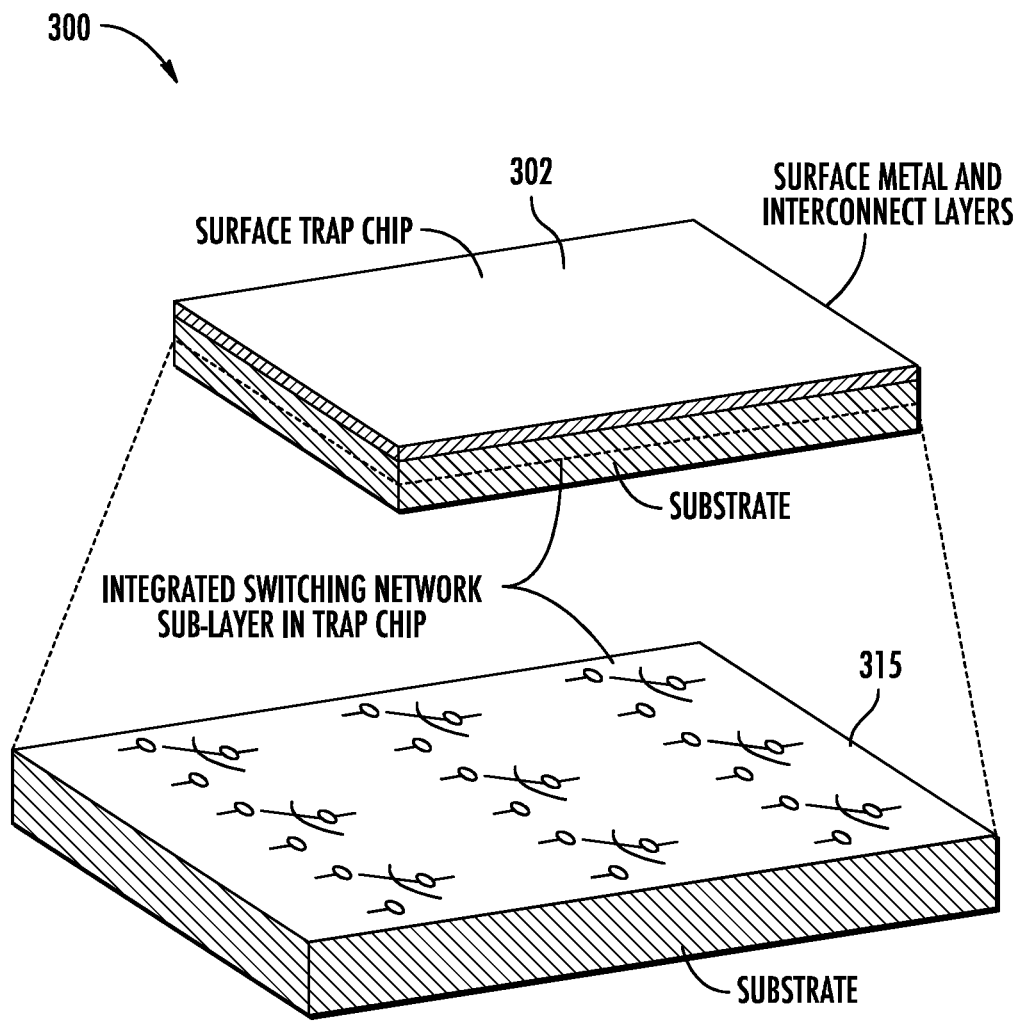

FIG. 3 provides a perspective view of an example ion trap apparatus, in accordance with an example embodiment.

FIG. 4A provides a perspective view of an example ion trap apparatus, in accordance with an example embodiment.

FIG. 4B provides a side section view of an example ion trap apparatus, in accordance with an example embodiment.

Figure 5:
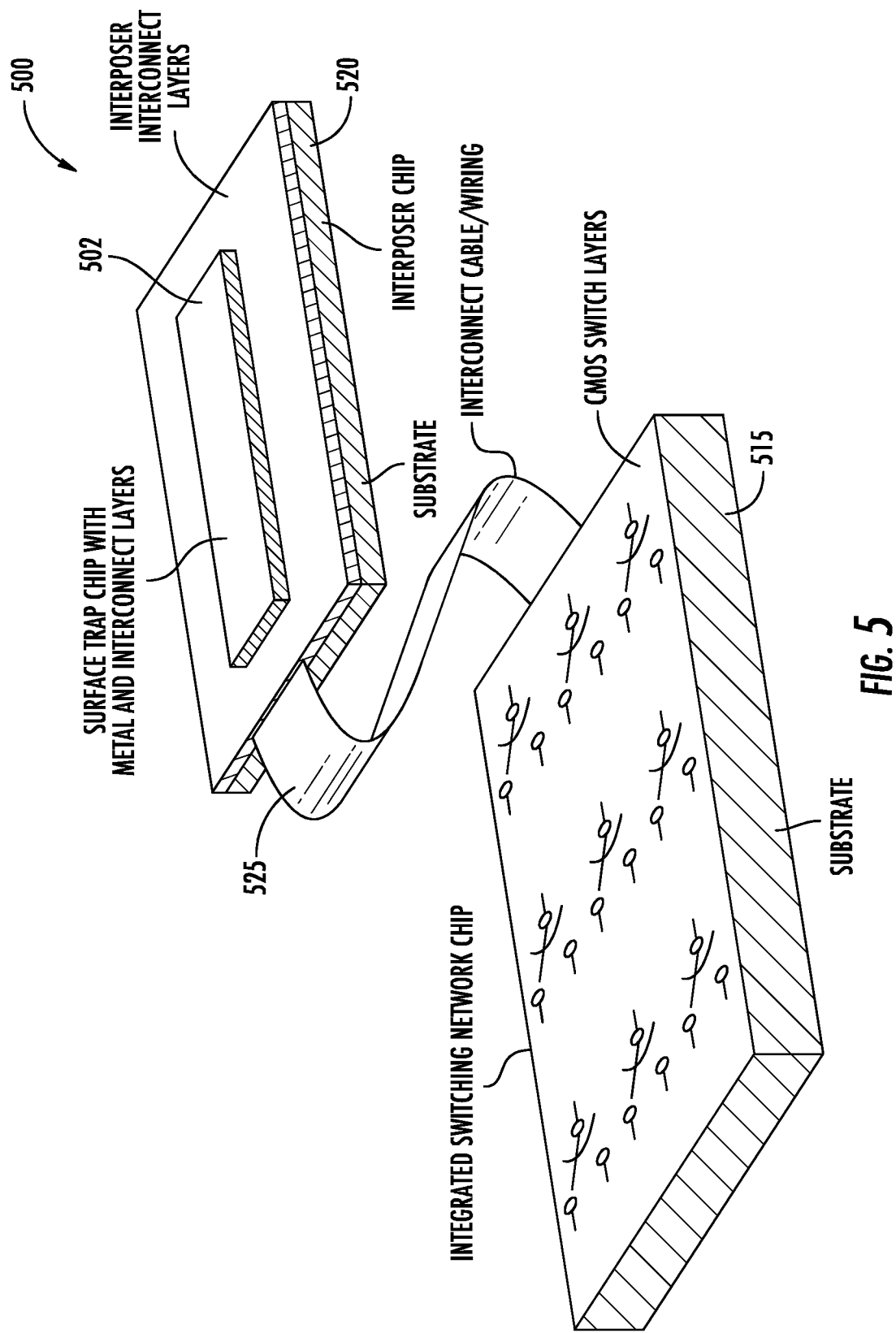

FIG. 5 provides a perspective view of another example ion trap apparatus, in accordance with an example embodiment.

Figure 6:
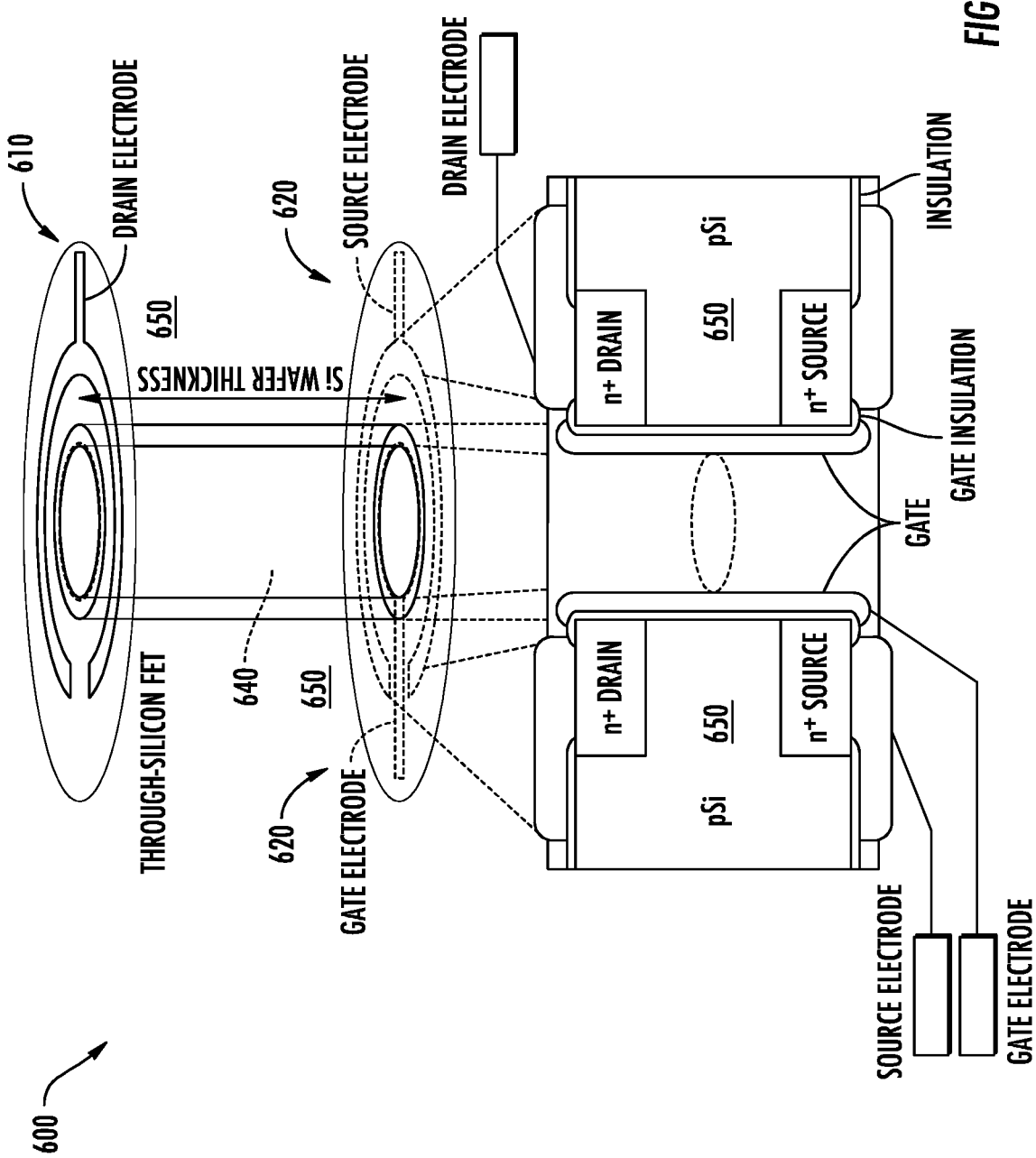

FIG. 6 provides a schematic diagram depicting a cross-sectional view of a through-silicon-via-field effect transistor (TSV-FET) structure, in accordance with an example embodiment.

FIG. 7A provides a schematic diagram of a series connected Field Effect Transistor (FET) switch implementation for an integrated switching apparatus, in accordance with an example embodiment.

FIG. 7B provides a timing diagram for the series connected FET switch implementation of FIG. 7A, in accordance with an example embodiment.

FIG. 8A provides a schematic diagram of a switched capacitor filter implementation for an integrated switching apparatus, in accordance with an example embodiment.

FIG. 8B provides a simulated signal versus frequency roll-off curve for the switched capacitor filter implementation of FIG. 8A, in accordance with an example embodiment.

Figure 9B:
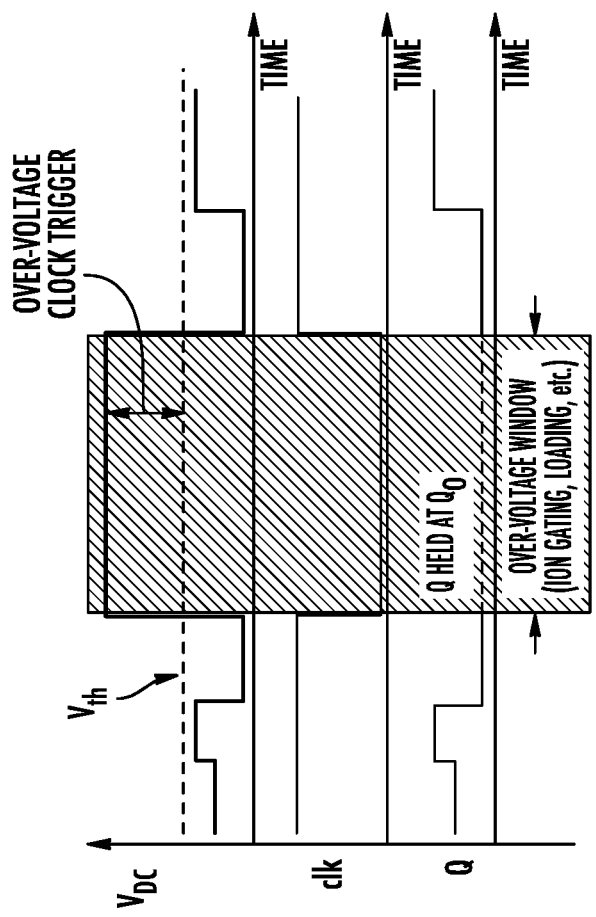
Figure 9A:
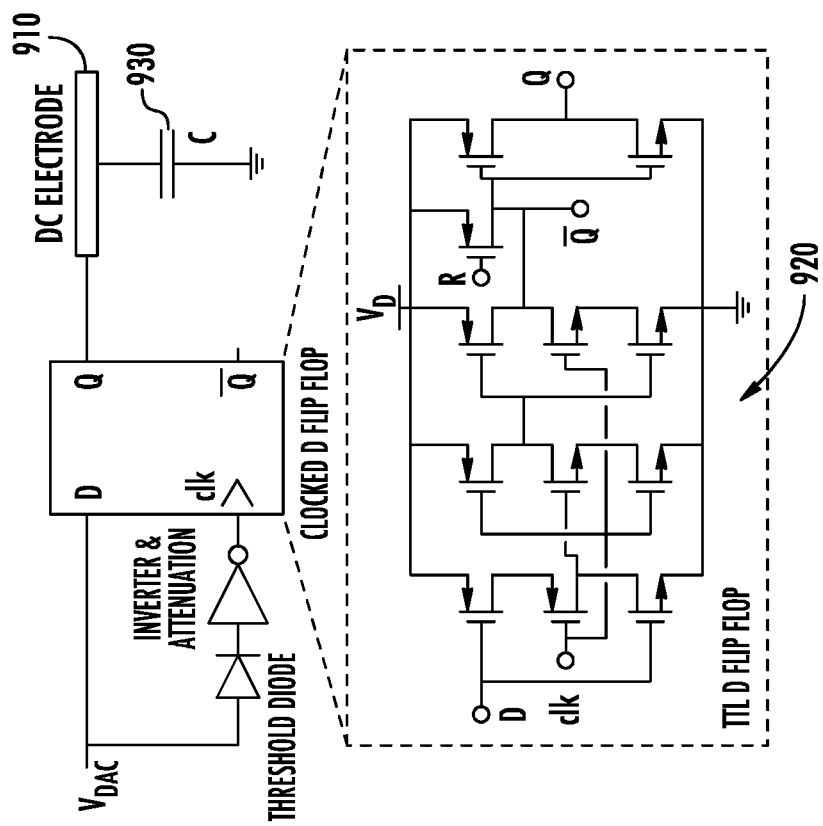

FIG. 9A provides a schematic diagram of an integrated circuit implementation for an integrated switching apparatus, in accordance with an example embodiment.

FIG. 9B provides a timing diagram for the integrated circuit implementation of FIG. 9A, in accordance with an example embodiment.

Figure 10:
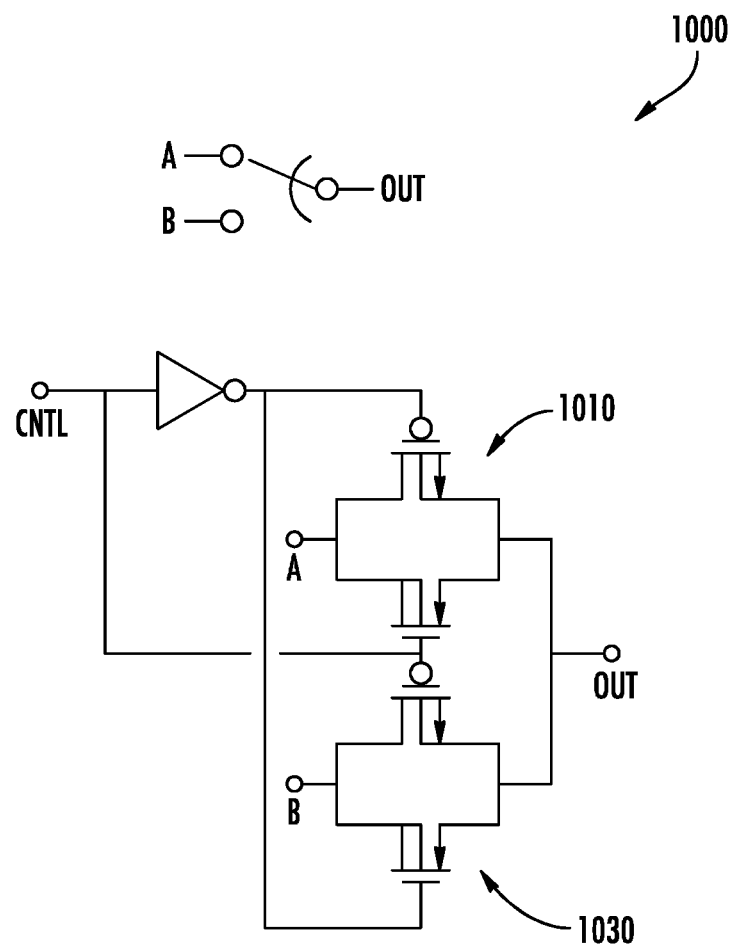

FIG. 10 provides a schematic of a single pole double throw (SPDT) complementary metal oxide semiconductor (CMOS) switch for an integrated switching apparatus, in accordance with an example embodiment.

Figure 11:
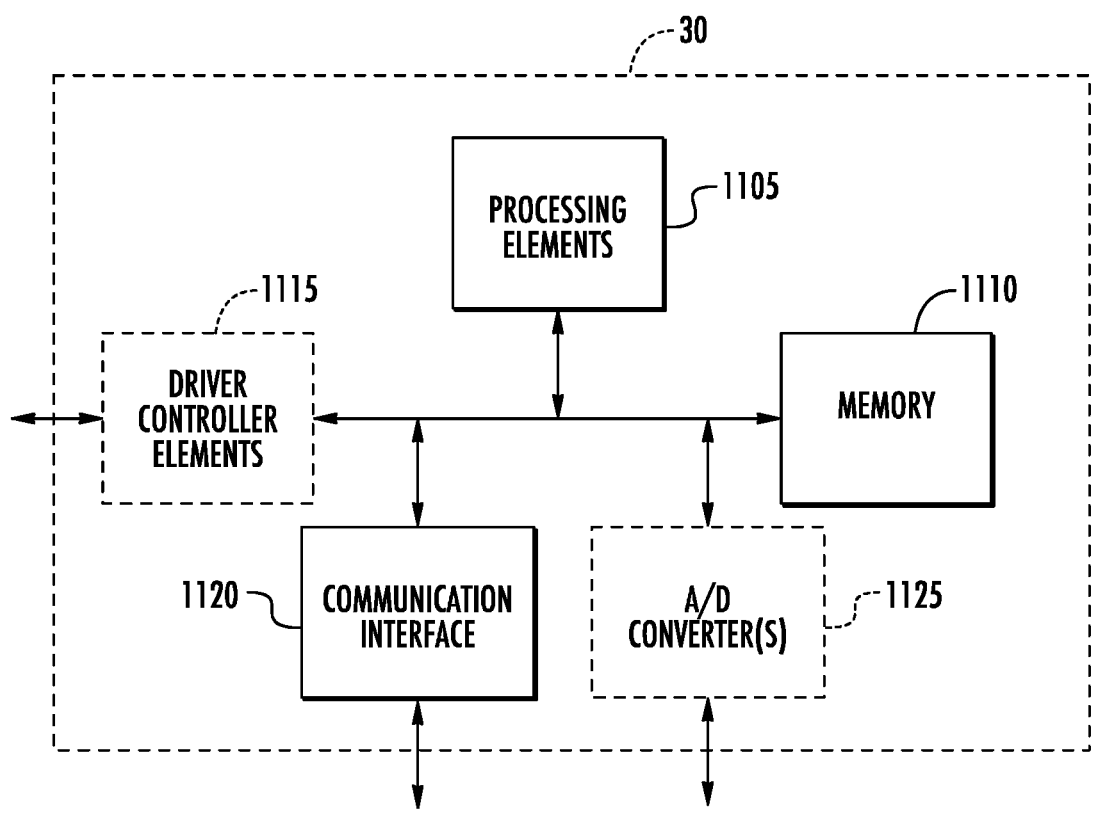

FIG. 11 provides a schematic diagram of an example controller of a quantum computer comprising an ion trap apparatus, in accordance with an example embodiment.

Figure 12:
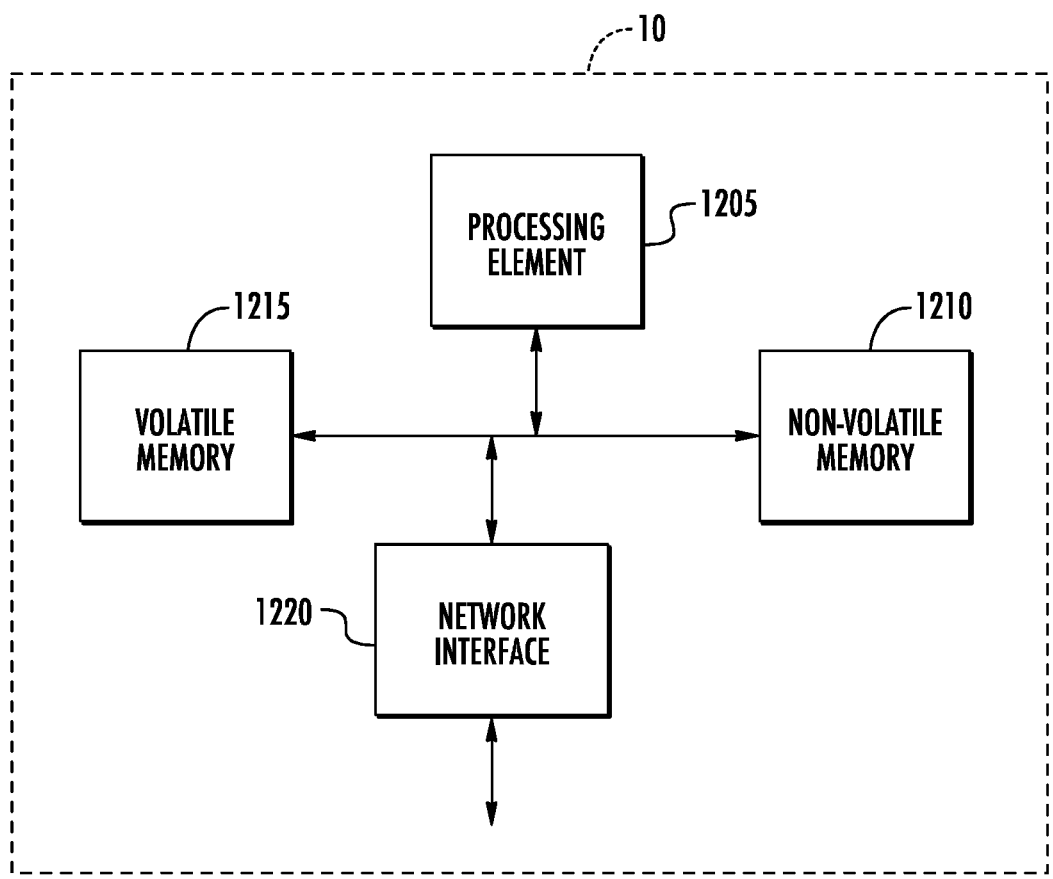

FIG. 12 provides a schematic diagram of an example computing entity of a quantum computer system that may be used in accordance with an example embodiment.

DETAILED DESCRIPTION OF SOME EXAMPLE EMBODIMENTS

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. The term "or" (also denoted "/") is used herein in both the alternative and conjunctive sense, unless otherwise indicated. The terms "illustrative" and "exemplary" are used to be examples with no indication of quality level. The terms "generally" and "approximately" refer to within engineering and/or manufacturing limits/tolerances and/or within user measurement capabilities, unless otherwise indicated. Like numbers refer to like elements throughout.

Exemplary Ion Trap Apparatus

In various embodiments, an ion trap apparatus comprises a cuboid structure having an upper surface, a lower surface (e.g., substrate) and a plurality of layers therebetween (e.g., a plurality of interconnect layers). The upper surface of the ion trap apparatus comprises an ion trap/ion trap chip (e.g., a surface ion trap/chip) having a plurality of electrodes. In various embodiments, an ion trap/ion trap chip is or comprises a device configured to trap charged particles in space using electric or electromagnetic fields such as a surface ion trap, a symmetric ion trap, an asymmetric ion trap, a linear ion trap, a one, two or three dimensional ion trap, and/or the like. In various embodiments, the ion trap apparatus comprises potential generating elements such as electrodes of the ion trap. In various embodiments, the potential generating elements are configured to, when appropriate voltage signals are applied thereto, generate one or more potential wells configured to trap and/or confine atomic objects such as ions and/or charged particles. An example ion trap apparatus comprises an interposer component/layer (e.g., interposer chip), an ion trap (e.g., surface ion trap/chip), combinations thereof, and/or the like. The example ion trap apparatus may be configured to operate within a cryogenic/vacuum chamber.

Additionally, in various embodiments, the ion trap apparatus comprises an integrated switching apparatus (e.g., integrated switching chip, integrated switching network layer, integrated switching component, and/or the like) disposed between the plurality of interconnect layers and the lower surface (e.g., substrate) of the ion trap apparatus. In some embodiments, the integrated switching apparatus is adjacent (e.g., within the sample plane and next to and/or a layer immediately below) the ion trap apparatus. In various embodiments, the integrated switching apparatus comprises a plurality of monolithically-integrated controls and/or switches configured to condition a voltage signal applied to at least one of the plurality of potential generating elements (e.g., electrodes).

It is to be understood that the disclosure is not to be limited to the specific examples disclosed herein, and that modifications and other examples are intended to be included within the scope of the appended claims. Although specific terms and examples are described herein, they are used in a descriptive sense only and not for purposes of limitation.

FIGS. 1A-B provide a schematic side view and top view, respectively, of an ion trap apparatus 100 in accordance with an example embodiment. As shown, the ion trap apparatus 100 comprises a surface ion trap 102 coupled with an integrated switching apparatus 115 (e.g., a monolithically-integrated switching apparatus). As shown, the surface ion trap 102 and integrated switching apparatus 115 form/define a unitary body. In various embodiments, the integrated switching apparatus 115 may be adjacent, proximate or coupled to any surface of the ion trap (e.g., surface ion trap 102) and/or ion trap apparatus 100.

As illustrated in FIG. 1A, the integrated switching apparatus 115 may be proximate and/or coupled to the lower surface of the ion trap/ion trap chip. In various examples, the ion trap apparatus 100 and/or ion trap (e.g., surface ion trap 102) and/or ion trap chip may be fabricated using various techniques, including semiconductor fabrication techniques, for example without limitation, bump bonding, direct fabrication techniques, and/or the like. Alternatively, the ion trap (e.g., surface ion trap 102) and the integrated switching apparatus 115 are configured side-by-side and/or are substantially coplanar with respect to one another. The surface ion trap 102 is at least partially defined by a number of sequences of electrodes 114. The integrated switching apparatus 115 is configured to control and/or condition voltage signals applied to one or more electrodes 116 of the number of sequences of electrodes 114. In various embodiments, the integrated switching apparatus 115 comprises a monolithically-integrated interposer component (e.g., interposer chip). Alternatively, the interposer component (e.g., interposer chip) and/or integrated switching apparatus 115 may be adjacent the ion trap apparatus 100.

Referring to FIG. 1B, the example surface ion trap 102 is at least partially defined by a number of radio frequency (RF) electrodes 112 (e.g., 112A, 112B, also referred to herein as RF rails) and a number of sequences of electrodes (e.g., 114A, 114B, 114C). The term "electrodes" may also refer to, but is not limited to, direct current (DC) electrodes, trapping and/or transport electrodes, control electrodes, and/or the like which are used herein interchangeably. In an example embodiment, the surface ion trap 102 is a surface Paul trap with symmetric sequences of electrodes. In various embodiments, the potential generating elements of the ion trap apparatus 100 comprise DC electrodes 116 of the sequences of electrodes 114 and the RF electrodes 112. In various embodiments the DC electrodes 116 are configured to have sequences of voltages applied thereto to cause the formation of and/or control the depth and/or location of one or more potential wells configured to trap and/or confine ions, charged particles, and/or the like. In various embodiments, the upper surface of the surface ion trap 102 has a planarized topology.

The integrated switching apparatus 115 may comprise an integrated switching chip, integrated switching network layer, integrated switching component and/or the like. The integrated switching apparatus 115 may comprise a plurality of monolithically-integrated control components (e.g., filters, transistors, switches, electronic components and/or the like) and define a compact integrated circuit for performing voltage signal conditioning operations including switching, amplification, filtration, signal routing and/or the like. A variety of circuit architectures may be realized, including but not limited to, solid-state switch circuit architectures.

Figure 4:
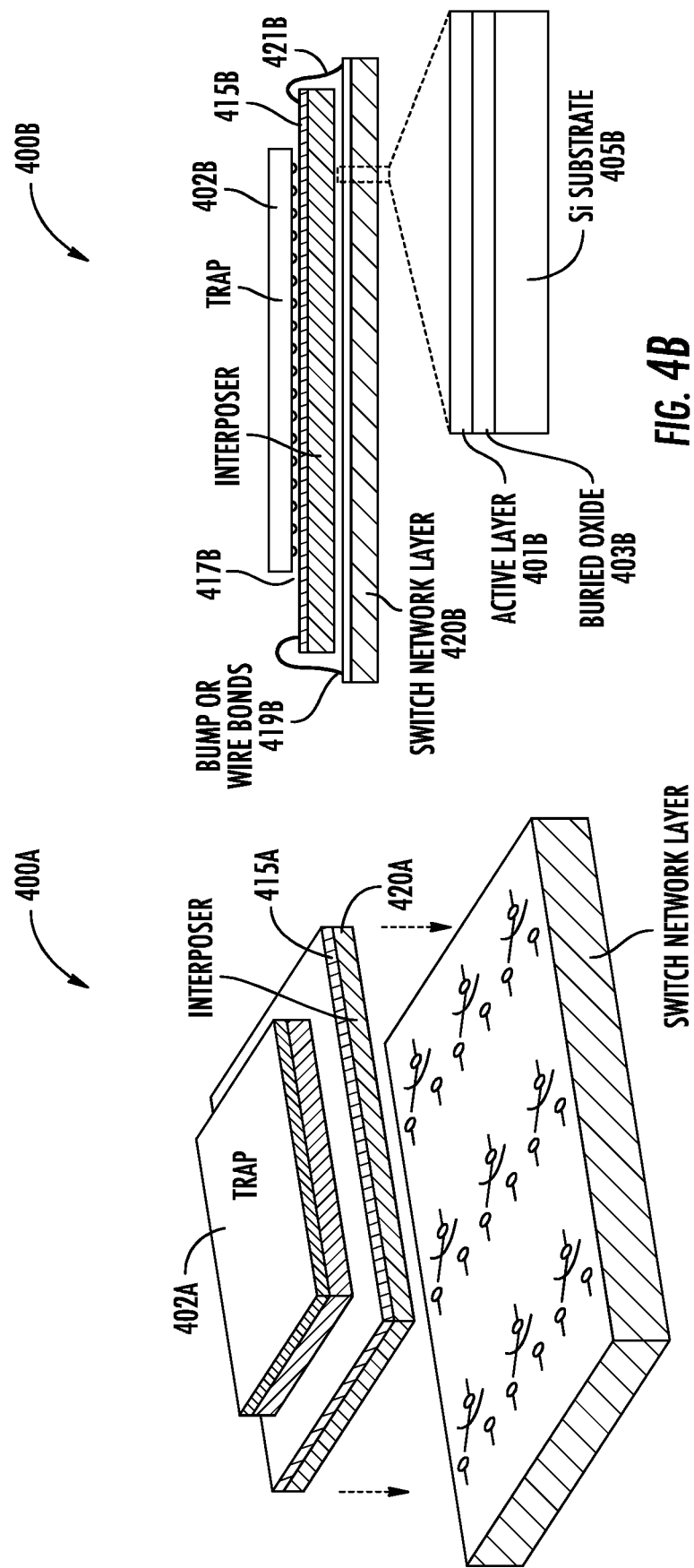

FIGS. 3-5 provide various configurations of ion trap apparatuses in accordance with some example embodiments. It is noted that the scope of the present disclosure is not limited to the examples herein. In some embodiments, an ion trap apparatus may comprise one or more additional and/or alternative materials or components and may be alternatively configured.

As illustrated in FIG. 3, an example ion trap apparatus 300 may comprise a cuboid structure having an upper surface, a lower surface (e.g., substrate) and a plurality of layers therebetween. As shown, the ion trap apparatus 300 is a unitary body comprising a plurality of layers and components. The upper surface of the ion trap apparatus 300 comprises an ion trap chip 302 (e.g., surface ion trap chip) having a plurality of electrodes. The lower surface (e.g., substrate) of the ion trap apparatus 300 comprises an integrated switching apparatus 315 (e.g., integrated switching network). The integrated switching apparatus 315 may comprise a plurality of monolithically-integrated controls and/or switches configured to condition a voltage signal applied to at least one of the plurality of electrodes. Additionally, the ion trap apparatus 300 comprises one or more interconnect layers, including without limitation, surface metal(s) disposed between the ion trap chip 302 and the lower surface (e.g., substrate). The ion trap chip 302, integrated switching apparatus 315 and interconnect layers may be coupled to one another (e.g., bonded, fastened, attached, co-fabricated and/or the like).

FIGS. 4A-4B provide a perspective view and side section view, respectively, of an ion trap apparatus 400A and 400B in accordance with an example embodiment.

As illustrated in FIG. 4A, the example ion trap apparatus 400A may comprise a cuboid structure having an upper surface, a lower surface (e.g., substrate) and a plurality of layers therebetween. As shown, the ion trap apparatus 400A defines a unitary body comprising a plurality of layers and components. The upper surface of the ion trap apparatus 400A comprises an ion trap chip 402A (e.g., surface ion trap chip) having a plurality of electrodes. The lower surface (e.g., substrate) of the ion trap apparatus 400A comprises an integrated switching apparatus 420A (e.g., integrated switching network). The integrated switching apparatus 420A may comprise a plurality of monolithically-integrated controls and/or switches configured to condition a voltage signal applied to at least one of the plurality of electrodes. Additionally, the ion trap apparatus 400A comprises an interposer component 415A (e.g., interposer chip) disposed between the upper surface and the lower surface (e.g., substrate) of the ion trap apparatus 400. In various examples, the ion trap chip 402A, integrated switching apparatus 420A and interposer component 415A (e.g., interposer chip) may be coupled to one another (e.g., bonded, fastened, attached, co-fabricated and/or the like). In some examples, the integrated switching apparatus 420A (e.g., integrated switching network) and the interposer component 415A may consist of a single component. For example, in an example embodiment, the integrated switching apparatus 420A (e.g., integrated switching network) is part of (e.g., integrated into) the interposer component 415A.

As illustrated in FIG. 4B, the example ion trap apparatus 400B comprises a cuboid structure having an upper surface, a lower surface (e.g., substrate) and a plurality of layers therebetween. As shown, the ion trap apparatus 400B defines a unitary body comprising a plurality of layers and components. The upper surface of the ion trap apparatus 400 comprises an ion trap chip 402B (e.g., surface ion trap chip) having a plurality of electrodes. As further depicted, the lower surface (e.g., substrate) of the ion trap apparatus 400B comprises an integrated switching apparatus 420B (e.g., integrated switching network). The integrated switching apparatus 420B may comprise a plurality of monolithically-integrated controls and/or switches configured to condition a voltage signal applied to at least one of the plurality of electrodes. Additionally, the ion trap apparatus 400B comprises an interposer component 415B (e.g., interposer chip) disposed between the upper surface and the lower surface (e.g., substrate) of the ion trap apparatus 400B In various examples, the ion trap chip 402B, integrated switching apparatus 420B and interposer component 415B (e.g., interposer chip) may be coupled to one another (e.g., bonded, fastened, attached, co-fabricated and/or the like), in some examples via bump bonds, wire bonds, combinations thereof, and/or the like. As depicted in FIG. 4B, in some examples, the ion trap chip 402B and the interposer component 415B may be coupled to one another via bump bonds 417B. As further depicted in FIG. 4B, the interposer component 415B and the integrated switching apparatus 420B may be electronically coupled to one another via wire bonds 419B and 421B.

In some embodiments, as further depicted in FIG. 4B, the integrated switching apparatus 420B may comprise a plurality of layers and/or substrates. As illustrated, the integrated switching apparatus 420B comprises an active layer 401B defining a top surface/layer of the integrated switching apparatus 420B. As further depicted, the integrated switching apparatus 420B comprises a silicon substrate 405B defining a bottom surface/layer of the integrated switching apparatus 420B. Additionally, as shown, the integrated switching apparatus 420B comprises a buried oxide layer disposed between the active layer 401B and the silicon substrate 405B.

As illustrated in FIG. 5, an example ion trap apparatus 500 comprises a cuboid structure having an upper surface, a lower surface (e.g., substrate) and a plurality of layers therebetween. As shown, the integrated switching apparatus (e.g., integrated switching network chip) is separate/distinct from the other components of the ion trap apparatus 500. The upper surface of the ion trap apparatus 500 comprises an ion trap chip 502 (e.g., surface ion trap chip) having a plurality of electrodes. The lower surface (e.g., substrate) of the ion trap apparatus 500 comprises an interposer component 520 (e.g., interposer chip) coupled to the upper surface of the ion trap apparatus 500. The ion trap chip 502 may be coupled to (e.g., bonded, fastened, attached, co-fabricated and/or the like) the interposer component 520 (e.g., interposer chip). The integrated switching apparatus 515 may be proximate or adjacent other components of the ion trap apparatus 500. As shown, the integrated switching apparatus 515 is separate/distinct from the ion trap chip 502 and the interposer component 520 (e.g., interposer chip). In the illustrated embodiment, the integrated switching apparatus 515 comprises a plurality of monolithically-integrated controls and/or switches configured to condition a voltage signal applied to at least one of the plurality of electrodes. In some embodiments, as shown, the integrated switching apparatus 515 is connected to the ion trap chip 502/interposer component 520 via an interconnect 525 (e.g., cable, wiring, and/or the like). In other embodiments, the integrated switching apparatus 515 communicates or interfaces with one or more components of the ion trap apparatus 500 without an interconnect (using direct wiring, leads fabricated as part of the ion trap apparatus 500, through vias, and/or the like). In some embodiments, the ion trap apparatus 500 may comprise combinations of distinct/separate (e.g., connected) integrated switching apparatuses 515 and one or more integrated switching network layers.

Returning to FIG. 1B, in various embodiments, the surface ion trap 102 comprises and/or is at least partially defined by a number of RF electrodes 112. The RF electrodes 112 may be formed with substantially parallel longitudinal axes and with substantially coplanar upper surfaces. For example, as shown, the RF electrodes 112 are substantially parallel such that a distance between the RF electrodes 112 is approximately constant along the length of the RF electrodes 112. For example, the upper surfaces of the RF electrodes 112 may be substantially flush with the upper surface of the surface ion trap 102. In various embodiments, the surface ion trap 102 may comprise a plurality of RF electrodes 112. For example, the surface ion trap 102 may be a two-dimensional ion trap that comprises multiple numbers (e.g., pairs and/or sets) of RF electrodes 112 with each number (e.g., pair and/or set) of lengths of electrodes 112 having substantially parallel longitudinal axes. FIG. 1A illustrates an example one dimensional ion surface trap 102 of an ion trap apparatus 100 having two RF electrodes 112, though other embodiments may comprise additional RF electrodes in various configurations.

In various embodiments, two adjacent RF electrodes 112 are separated (e.g., insulated) from one another by a gap 105. For example, the gap defines (in one or two dimensions) the confinement channel or region of the surface ion trap 102 in which one or more atomic objects (e.g., ions, charged particles, and/or the like) may be trapped at various locations within the surface ion trap 102. In various embodiments, the gap 105 defined by the adjacent RF electrodes 112 extends substantially parallel to the longitudinal axes of the adjacent RF electrodes 112. For example, the gap 105 may extend substantially parallel to the y-axis. In an example embodiment, the gap 105 is at least partially filled with an insulating material (e.g., a dielectric material). In various embodiments, the dielectric material is silicon dioxide (e.g., formed through thermal oxidation) and/or other dielectric and/or insulating material. In various embodiments, the longitudinal gap 105 has a height (e.g., in the x-direction, as illustrated in FIG. 1B) of approximately 40 μm to 500 μm. In various embodiments, one or more sequences of DC electrodes 114 (e.g., a second sequence of DC electrodes 114B) may be disposed and/or formed within the gap 105.

In an example embodiment, a transverse gap exists between neighboring and/or adjacent electrodes 116 of the one or more sequences of electrodes 114. In various embodiments, the transverse gap is empty space and/or at least partially filled with a dielectric material to prevent electrical communication between neighboring and/or adjacent electrodes. In an example embodiment, a longitudinal gap exists between a sequence of DC electrodes 114 and a neighboring and/or adjacent length of electrodes 112. In an example embodiment, the gap is at least partially filled with a dielectric and/or insulating material to prevent electrical communication between DC electrodes 116 of the sequence of electrodes 114 and the length of electrodes 112. In an example embodiment, the gap between neighboring and/or adjacent electrodes is in the range of approximately 1-10 μm.

In an example embodiment, a number (e.g., pair) of RF electrodes 112 are formed between a first sequence of DC electrodes 114A and a third sequence of DC electrodes 114C with a second sequence of DC electrodes 114B extends along the longitudinal channel 105 between the electrodes 112. For example, in an example embodiment, each sequence of DC electrodes 114 extends in a direction substantially parallel to the longitudinal axes of the RF electrodes (e.g., in the y-direction). In various embodiments, the upper surfaces of the sequences of DC electrodes 114 are substantially coplanar with the upper surfaces of the RF electrodes.

In various embodiments, signals may be applied to the RF electrodes to generate an electric and/or magnetic field that acts to maintain a trapped ion and/or charged particle. In various embodiments, sequences of DC voltages are applied to the DC electrodes 116 to generate a time-dependent electric potential field that causes the ions, charged particles, and/or the like trapped and/or confined by the ion trap apparatus to traverse corresponding trajectories to perform various transportation functions. In various embodiments, the number of sequences of DC electrodes 114 may, in combination, be biased, with DC voltages that contribute to a variable combined electrical and/or magnetic field to trap at least one ion, charged particle, and/or the like in a potential well above at least one of either an upper surface of the sequences of DC electrodes 114 and/or the RF electrodes 112. For example, the electrical and/or magnetic field generated at least in part by voltages applied to the DC electrodes of the sequences of DC electrodes 114 may trap at least one ion in a potential well above the upper surface of the second sequence of DC electrodes 114B and/or the gap 105. Additionally, the DC voltages applied to the electrodes 116 may cause ions, charged particles, and/or the like trapped within the potential well above the upper surface of the second sequence of DC electrodes 114B and/or the longitudinal gap 105 to traverse trajectories such that one or more transportation functions are performed.

In various embodiments, the sequences of DC voltages applied to the DC electrodes 116 are controlled by one or more connected devices (e.g., a controller 30 as shown in FIGS. 2 and 11 and/or the like) via leads. For example, depending on the positive or negative charge on the at least one ion, charged particle, and/or the like, DC voltages applied to the DC electrodes 116 in the vicinity of a particular ion, charged particle, and/or the like are raised and/or lowered to cause the particular ion, charged particle, and/or the like to traverse a desired trajectory. For example, a controller 30 may control a voltage driver to cause the voltage driver to apply a sequence of DC voltages to the DC electrodes 116 (e.g., via the integrated switching apparatus 115) to generate a time-dependent electric potential (e.g., an electric potential that evolves with time) that causes the ions, charged particles, and/or the like trapped and/or confined by the ion trap apparatus to traverse the desired trajectories to cause a transportation function to be performed.

Depending on such factors as the charge on the at least one ion, charged particle, and/or the like and/or the shape and/or magnitude of the combined electrical and/or magnetic fields, the at least one ion, charged particle, and/or the like can be stabilized at a particular distance (e.g., approximately 20 μm to approximately 200 μm) above an upper surface of the surface ion trap 102 (e.g., the coplanar upper surface of the sequences of DC electrodes 114 and lengths of electrodes 112). To further improve various operations (e.g., control the transit of ions along desired trajectories), the surface ion trap/ion trap apparatus may be operated within a cryogenic and/or vacuum chamber capable of cooling the ion trap to a temperature of less than 124 Kelvin (e.g., less than 100 Kelvin, less than 50 Kelvin, less than 10 Kelvin, less than 5 Kelvin, and/or the like), in various embodiments. In various embodiments the integrated switching apparatuses of the ion trap apparatus are configured to operate within a cryogenic and/or vacuum chamber.

In various embodiments, the RF electrodes 112, the sequences of electrodes 114, and/or the confinement potential generated by the lengths of electrodes and/or the sequences of electrodes 114 define a confinement plane 103 of the ion trap. In various embodiments, the RF electrodes 112, the sequences of electrodes 114, and/or the confinement potential generated by the lengths of electrodes and/or the sequences of electrodes 114 define an axis 101 of the ion trap. In an example embodiment, the RF null of the ion trap apparatus (e.g., the null line of the pseudopotential generated by the application of the RF voltage signal to the RF electrodes 112) is substantially parallel to the axis 101 and located within the confinement plane 103.

In various embodiments, the ions, charged particles, and/or the like trapped and/or confined by the surface ion trap 102 of the ion trap apparatus 100 experience a confinement potential generated by the RF electrodes 112 and a DC potential generated by the DC electrodes 116. In various embodiments, the confinement potential (e.g., a pseudopotential) generally acts to align the ions, charged particles, and/or the like within the surface ion trap 102 within the longitudinal gap 105 and/or along the ion trap axis 101. For example, the confinement potential may be generally tube and/or cigar shaped to confine the atomic objects within the longitudinal gap 105, in an example embodiment. In various embodiments, the confinement potential does not change while a transportation function is being performed. For example, the confinement potential may be approximately constant with respect to time during the performance of a transportation function. The DC potential, generated by applying sequences of voltages to the DC electrodes 116, is configured to cause the ions, charged particles, and/or the like to move through the combined potential (e.g., the potential experienced by the ions, charged particles, and/or the like, as result of the superposition of the confinement potential and the DC potential) to perform the transportation function. For example, sequences of voltages may be applied to the DC electrodes 116 to cause minima in the combined potential (e.g., potential wells) at particular positions at particular times such that the minima in the combined potential guide the ions, charged particles, and/or the like through the trajectories corresponding to the transportation function.

Exemplary Quantum Computer Comprising an Ion Trap Apparatus

FIG. 2 provides a schematic diagram of an example quantum computer system 200 comprising an ion trap apparatus 70 (e.g., such as ion trap apparatus 100, 300, 400A, 400B, and/or 500), further comprising an integrated switching apparatus 75 (e.g., such as integrated switching apparatus 115, 315, 420A, 420B, and/or 515), in accordance with an example embodiment. In various embodiments, the quantum computer system 200 comprises a computing entity 10 and a quantum computer 210. In various embodiments, the quantum computer 210 comprises a controller 30, a cryogenic and/or vacuum chamber 40 enclosing an ion trap apparatus 70, and one or more manipulation sources 60. In an example embodiment, the one or more manipulation sources 60 may comprise one or more lasers (e.g., optical lasers, microwave sources, and/or the like). In various embodiments, the one or more manipulation sources 60 are configured to manipulate and/or cause a controlled quantum state evolution of one or more ions trapped and/or confined by the ion trap/ion trap apparatus 70. For example, in an example embodiment, wherein the one or more manipulation sources 60 comprise one or more lasers, the lasers may provide one or more laser beams, 66A, 66B, 66C to the ion trap 70 within the cryogenic and/or vacuum chamber 40. In various embodiments, the quantum computer 210 comprises one or more voltage sources 50. For example, the voltage sources 50 may comprise a plurality of DC voltage drivers and/or voltage sources and/or at least one RF driver and/or voltage source. The voltage sources 50 may be electrically coupled to the corresponding DC electrodes and/or RF electrodes of the ion trap apparatus 70 via an integrated switching apparatus 75.

In various embodiments, a computing entity 10 is configured to allow a user to provide input to the quantum computer 210 (e.g., via a user interface of the computing entity 10) and receive, view, and/or the like output from the quantum computer 210. The computing entity 10 may be in communication with, coupled and/or connected to the controller 30 of the quantum computer 210 via one or more wired or wireless networks 20 and/or via direct wired and/or wireless communications. In an example embodiment, the computing entity 10 may translate, configure, format, and/or the like information/data, quantum computing algorithms, and/or the like into a computing language, executable instructions, command sets, and/or the like that the controller 30 can understand and/or implement.

In various embodiments, the controller 30 is configured to control the voltage sources 50, cryogenic system and/or vacuum system controlling the temperature and pressure within the cryogenic and/or vacuum chamber 40, manipulation sources 60, and/or other systems controlling various environmental conditions (e.g., temperature, pressure, and/or the like) within the cryogenic and/or vacuum chamber 40 and/or configured to manipulate and/or cause a controlled evolution of quantum states of one or more ions, charged particles, and/or the like trapped and/or confined by the surface ion trap 102 of the ion trap apparatus 100. In various embodiments, the ions and/or charged particles trapped within the surface ion trap 102 are used as qubits of the quantum computer 210. The controller 30 may be electrically coupled to the integrated switching apparatus 75 such that the control components (e.g., switches) of the integrated switching apparatus 75 control and/or condition voltage signals (e.g., generated by the voltages sources 50) applied to the control electrodes (e.g., DC electrodes and/or RF electrodes) of the ion trap apparatus 70. For example, in an example embodiment, each integrated switch of the integrated switching apparatus 75 corresponds to a control/DC electrode.

Exemplary Ion Trap Apparatus Architecture

In future generations of trap control electronics, it is anticipated that nearly all of the primary control electronics will be positioned inside the cryogenic environment (e.g., within the cryogenic and/or vacuum chamber 40) in order to manage requirements for the high control electrode count per qubit. Control electronics within the cryogenic and/or vacuum chamber 40 will require switching and filtration operations. Integrated switching apparatuses may serve as fundamental building blocks for the realization of higher-order functions, therefore reducing the overall volume of electronics external and internal to the cryogenic and/or vacuum chamber 40 and/or the ion trap chip. Monolithically-integrated field effect transistor (FET)-based switches and capacitors in various configurations disclosed herein provide user control of DC electrode signal switching and noise mitigation on ion trap apparatuses (e.g., apparatuses with surface ion traps).

In some embodiments, metal-semiconductor field effect transistors (MOSFETs) may be integrated with ion trap apparatuses during surface trap fabrication. Such switches may be configured in either a conventional lateral architecture or by means of a through-silicon-via-field effect transistor (TSV-FET) structure. The TSV-FET approach addresses the need for large numbers of interconnects for current and future trap generations. TSV-FETs include source and drain terminals and a gate electrode for charge control. Due to the nature of the fabrication process, the TSV-FET can easily be integrated with trench capacitor structures for DC electrode shunt capacitors. Additionally, the TSV-FET switch reduces the integrated electronics footprint since it is a vertically-oriented through the wafer structure in comparison to a lateral FET configuration that consumes lateral area, therefore, freeing up real-estate for and/or enabling densification of interconnects.

Various embodiments for integrated TSV-FET switches are disclosed herein. In some embodiments, a TSV-FET switch may be a monolithically-integrated series-connected interconnect between the control electronics' Digital-to-Analog Converter (DAC) output and the DC electrodes. This embodiment enables the function of DAC-controlled momentary disconnection from the DC electrodes for DAC-originated noise elimination. Such a system can eliminate noise due to control electronics while maintaining DC electrode voltages limited by the inherent discharge rate of the electrode. The gate electrode in the lateral FET switch and/or the TSV-FET configuration, may be/comprise an optically driven electrode (e.g., an optocoupled phototransistor) providing fewer direct electrical connections and UHV chamber feedthroughs for the minimization of control. For example, the gate electrode is driven using an optical signal (e.g., a laser beam) that is transmitted through a window of the cryogenic and/or vacuum chamber 40 rather than a wired voltage signal, in various embodiments.

In some embodiments, a switched-capacitor filter (e.g., two Metal Insulator Metal capacitors, trench capacitors and/or the like) is integrated (e.g., monolithically fabricated) into a wafer and the TSV-FET switches one capacitor in and out of a parallel configuration, thereby changing the roll-off (knee) frequency for the low-pass filter. In this configuration, one capacitor remains in the circuit at all times and serves as the primary AC shunt capacitor for capacitive division of the RF pickup (e.g., for applying the RF voltage signal to the RF electrodes and/or applying DC voltage sequences to the DC electrodes). A switchable roll-off for trapped ion quantum computing applications provides a first roll-off frequency for fast transport operations that require significant bandwidth (e.g., approaching MHz) and a second, lower frequency roll-off for higher-sensitivity operations to minimize DAC- and amplifier-injected noise.

In some embodiments, a switched DC electrode shunt capacitor configuration is provided. As a way to minimize the number of additional control interconnects that must interface with control electronics external to the cryogenic and/or vacuum chamber 40, an optical switch such as the optically-gated transistor portion of an opto-isolator may be integrated as the switch. This configuration utilizes an optical channel through a viewport 45 (e.g., 45A, 45B, 45C) in the cryogenic and/or vacuum chamber 40 as the control interconnect to the switch.

In some embodiments, an integrated switching network provides an over-voltage switch function to the DC electrodes that enables a single input control logic function for DC electrode voltage switching. In an example configuration, an ensemble of integrated FET switches comprise a diode-clocked D flip-flop. The circuit controls the data input on the DC electrodes in a pseudo-binary implementation where under normal conditions (i.e., $V_{DAC}<V_{th}$) the signal from the DAC is passed through to the DC electrode. When the control voltage is driven above a set threshold voltage, the flip flop latches the output of the previous input state for a prescribed period of time, during which gating (e.g., operation of a quantum logic gate on one or more ions, charged particles, and/or the like) and loading (e.g., loading of ions, charged particles, and/or the like into the ion trap) operations may be performed. When the control voltage falls below threshold voltage, the flip flop returns to the normal state of operation for transport (e.g., transportation of ions, charged particles, and/or the like to different positions within the ion trap).

In some embodiments, a diode-connected FET configuration for limiting voltage pulse magnitude is provided. In some embodiments, the gate-to-source and gate-to-drain capacitance of the TSV-FET as a through-silicon-capacitor (TSC) can be utilized for increased density of on-chip electrode capacitance. In some embodiments, wafer-integrated amplifiers (buffers, switch speed de-limiter, and/or the like) can be utilized for individual electrode control.

An example surface ion trap apparatus may comprise electronic infrastructure systems including, but not limited to, Digital-to-Analog Converters (DACs), memory, amplification, filtrations, interconnects, discrete controls, and/or the like. The electronic infrastructure systems may comprise a significant footprint of the hardware of the ion trap apparatus.

Typically, electronic infrastructure systems (e.g., comprising switches, diodes, capacitors and/or the like configured to supply, condition, and/or control voltage signals applied to control/DC electrodes), are configured to be operated from outside a cryogenic and/or vacuum chamber containing the ion trap apparatus, surface ion trap/ion trap chip whereas the ion trap apparatus may be located inside the cryogenic and/or vacuum chamber.

In such systems, in order to limit noise injected by external electronic infrastructure systems (e.g., control electronics), additional components (e.g., a plurality of capacitive filter banks) may be added to the external electronic infrastructure systems. Due to noise from the external electronic infrastructure systems, voltage signals applied to control electrodes (e.g., DC electrodes) to facilitate ion trapping/transport operations may require amplification resulting in an even higher volume of external electronic infrastructure systems, introducing additional noise. For example, to mitigate noise (e.g., transport sequences of voltages applied the DC electrodes) voltage signals may need to be amplified. Due to such amplification, some of the high frequency content attenuated by components of the electronic infrastructure systems (e.g. a plurality of capacitive filter banks) may be exaggerated during operations (e.g., ion trapping and transport operations).

In various embodiments, an example ion trap apparatus may comprise an integrated switching apparatus comprising one or more switches (e.g., Field Effect Transistors (FETs), diodes and/or capacitors) which control/condition voltage signals applied to DC electrodes. The monolithically-integrated switches facilitate control of signal switching and noise mitigation for the example ion trap apparatus.

An example ion trap apparatus may comprise an integrated switching apparatus comprising a plurality of control components/switches. Each control component/integrated switch may control and/or condition a voltage signal applied to one or more DC electrodes of the ion trap apparatus. The integrated switch may be or comprise one or more transistors (e.g., bipolar junction transistors, metal-oxide-semiconductor field effect transistors, metal-semiconductor field-effect transistors (MOSFETs), junction gate field-effect transistors, heterojunction bipolar transistors and high-electron-mobility transistors, NPN transistors, PNP transistors, and/or the like), diodes, capacitors and/or the like each associated with one or more DC electrodes. Additionally and/or alternatively, a plurality of control components/ switches, may define an integrated switching network. An integrated switching network may comprise amplifiers, buffers, delimiters, transmission gate switches, logic based transistor networks (e.g., a D-flip flop) and/or the like. For example, the integrated switching apparatus may comprise fixed RF-shunt capacitors serving as capacitive dividers integrated beneath the electrode interconnect layers to mitigate AC coupling between RF electrodes and DC electrodes of the ion trap (e.g., surface ion trap).

Control electronics may be integrated with/within the ion trap apparatus, such that the control electronics form part of the voltage supplying path (i.e., circuit) to the DC electrodes, providing a scaling path for large qubit count surface ion traps. Various configurations may be implemented including DC shunt capacitor dividers, filter banks, user-control switching (e.g., bandwidth tuning, DAC originated noise elimination based on the sequences of voltages applied to the DC electrodes), and/or the like.

In some embodiments, at least some of the control components/integrated switches of the integrated switching apparatus may be configured laterally (side-by-side) through the wafer/interposer of the ion trap apparatus. In some embodiments, at least some of the monolithically-integrated switches of the monolithically-integrated switching apparatus or may be configured vertically through the wafer/ interposer of the ion trap apparatus (e.g., utilizing a through-silicon via field effect transistor (TSV-FET) configuration). For example, the monolithically-integrated TSV-FET may comprise an on-chip amplifier or switch depending on a desired functionality. Vertical configurations of the monolithically-integrated switches such as the TSV-FET configuration further decrease the footprint of the overall ion trap apparatus. Various types of control components/integrated switches may be provided using a TSV-FET configuration including n-channel and p-channel for complementary switching, JFETs, MESFETs, bipolar and/or the like.

An example FET may comprise a drain separated from a source by a channel, and a gate separated from the channel by a thin layer of insulation. Providing a voltage at the gate causes current, carried by electrons/holes, to move/flow through the channel between the source and the drain. Disconnecting the voltage cuts off the current by halting the flow of the electrons/holes.

FIG. 6 illustrates an exemplary cross-sectional view of a TSV-FET structure 600 which may be included in an ion trap apparatus. The schematics are provided for illustrative purposes and are not intended to be limiting. For example, it should be understood that descriptions of a single switch of the integrated switching apparatus may be applicable to a plurality of such switches in an integrated switching apparatus. As shown, the channel/conduction path 640 is located vertically through a wafer/interposer 650 from drain 610 to source 620. A gate electrode 620 may be concentrically located on the interior of the TSV-FET structure 600. The gate electrode 620 may be capacitive with respect to the source 620 and the drain 610. An ion trap apparatus may comprise a plurality of TSV-FETs. For example, a plurality of TSV-FETs may be stacked vertically in an integrated switching apparatus of an ion trap apparatus. Portions of electronic infrastructure, integrated circuits, chips, processors and/or the like in an ion trap apparatus may comprise a plurality of TSV-FETs.

FIGS. 7A-7B, 8A-8B, 9 and 10A-10B illustrate exemplary configurations of an integrated switching apparatus configured to perform various control operations.

FIG. 7A provides a schematic of an exemplary series connected configuration of an integrated switch for an integrated switching apparatus comprising a capacitor 730 and an FET/switch 720 configured to control and/or condition a voltage signal applied to a series-connected DC electrode 710. In various embodiments, the FET/switch 720 is monolithically fabricated/integrated into the silicon wafer/interposer of the ion trap apparatus. The capacitor 730 is co-integrated with the FET/switch 720 in the silicon wafer/interposer of the ion trap apparatus. In various embodiments, the FET/switch is configured to function as an interconnect between the DC electrode 710 of the ion trap apparatus and the external controller/control electronics DAC output. The potential generated when the voltage signal is applied to the DC electrode 710 may be utilized for ion trapping and/or transport operations. Noise originating from the external controller/control electronics and/or another source external to the ion trap apparatus may be eliminated by momentarily disconnecting the DC electrode 710 from (the remainder of) the circuit. Thus, noise may be eliminated while maintaining DC electrode voltages limited by the inherent discharge rate of the DC electrode 710. In an example embodiment, a gate electrode of the FET/switch 720 is optically driven (e.g., by an optocoupled phototransistor) such that fewer direct electrical connections and cryogenic and/or vacuum chamber 40 (e.g., Ultra-High Vacuum chamber) feedthroughs are required to control and/or condition the voltage signal to the DC electrode 710 via the FET/switch. The FET/switch 720 may be switched between an 'ON' configuration (where a voltage signal is provided to the DC electrode 710) and an 'OFF' configuration (where there is no voltage signal to the DC electrode 710) or vice versa by causing an optical beam (e.g., generated by a laser or other optical source external to the cryogenic and/or vacuum chamber 40) to be incident on an optocoupled phototransistor in electrical communication with the FET/switch 720 (e.g., via a viewport 45) or to not be incident on the optocoupled phototransistor.

FIG. 7B illustrates a timing diagram for the series connected configuration of an integrated switch of the integrated switching apparatus of FIG. 7A. When the voltage signal to the DC electrode 710 is above a threshold and/or at a desired amplitude, the switch 720 is open/disconnected, and the capacitor 730 maintains/stores a voltage potential such that no noise from the external controller/control electronics can flow into the system and/or be applied to the DC electrode.

FIG. 8A provides a schematic of an exemplary switched capacitor filter configuration for an integrated switch of the integrated switching apparatus comprising two capacitors 820, 830 in a parallel configuration and an FET/switch 840 configured to control and/or condition a voltage signal applied to a DC electrode 810. In various embodiments, the capacitors 820, 830 are Metal Insulator Metal (MIM) capacitors, trench capacitors and/or the like. In various embodiments, the FET/switch 840 is monolithically fabricated/integrated into the silicon wafer/interposer of the ion trap apparatus. In an example embodiment, the capacitors 820, 830 are monolithically fabricated and/or co-integrated with the FET/switch 840 within the silicon wafer/interposer of the ion trap apparatus. In various embodiments, the FET/switch 840 is configured to function as an interconnect between the DC electrode 810 of the ion trap apparatus and the external controller/control electronics DAC output. As shown, one capacitor 830 may switch in and out of the parallel configuration to change the roll-off frequency, thereby implementing a low-pass filter. The other capacitor 820 remains in the circuit at all times and serves as the primary AC shunt capacitor for capacitive division of the RF pickup.

FIG. 8B illustrates a simulated signal versus frequency roll-off curve for the switched capacitor filter configuration of FIG. 8A. When the FET/switch 840 is open, only the capacitance of the first capacitor 820 is in the circuit, providing a first roll-off frequency. When the FET/switch 840 is closed, the capacitance of both capacitors 820, 830 is aggregated to provide a second roll-off frequency. In various embodiments, the higher roll-off frequency may be utilized for fast transport operations requiring significant bandwidth (e.g., approaching MHz frequency) and the lower roll-off frequency may be utilized for higher-sensitivity operations (e.g., to minimize noise from the external controller/control electronics DAC output).

FIG. 9A provides a schematic of an exemplary integrated circuit/switching network configuration for an integrated switch of an integrated switching apparatus comprising a DC electrode 910, a capacitor 930 and an integrated circuit 920 configured to control and/or condition a voltage signal applied to the DC electrode 910. The integrated circuit 920 may be monolithically fabricated/integrated into the silicon wafer/interposer of the ion trap apparatus. The capacitor 930 may be monolithically fabricated and/or co-integrated with the integrated circuit 920 within the silicon wafer/interposer of the ion trap apparatus. The integrated circuit 920 may function as an interconnect between the DC electrode 910 of the ion trap apparatus and the external controller/control electronics DAC output. As shown, the integrated circuit 920 may comprise a plurality of transistors (e.g., ten transistors) defining a diode-clocked D flip flop to provide an over-voltage switch function. In various embodiments, the integrated circuit 920 may facilitate a single input control logic function for DC electrode voltage switching. In various embodiments, a plurality of integrated circuits 920 may be associated/networked with a DC electrode 910. In some embodiments, the integrated circuits 920 may provide switching and/or capacitive functions as required.

FIG. 9B illustrates a timing diagram for the integrated circuit/switching network configuration of FIG. 9A. The data input on the DC electrode 910 may be controlled in a pseudo-binary implementation where under normal conditions $V_{DAC}<V_{th}$. When the control voltage is below a certain threshold, the signal from the DAC is passed to the DC electrode 910. When the control voltage is above the threshold, the flip flop latches the output for the previous input state for a prescribed period of time during which, for example, ion gating and loading operations may be performed. When the control voltage falls below the threshold, the flip flop returns to the normal state facilitating ion transport operations.

FIG. 10 illustrates an example single pole double throw (SPDT) complementary metal oxide semiconductor (CMOS) switch 1000 for an integrated switch of an integrated switching apparatus. As shown, the SPDT-CMOS switch 1000 is an analog switch comprising a p-channel MOSFET 1010 and an n-channel MOSFET 1030 configured to perform logic operations and isolate devices at its terminal when the switch is "OFF" and conduct analog and digital signals when the switch is "ON."

The integrated switching apparatus may comprise alternative configurations providing additional functionalities. For example, a voltage-out-of-range switch configuration may comprise a diode-connected FET arrangement for limiting voltage pulse magnitude. Additionally and/or alternatively, amplifiers (e.g., buffers, gain elements, switch speed delimiters and/or the like) may be integrated for individual control of the DC electrodes.

Technical Advantages

The electronic infrastructure responsible for ion control in surface ion traps is comprised of many systems (DACs, memory, amplification, filtration, interconnects, discretes, etc.) and makes up a significant footprint of the entire hardware system. For every new generation of surface trap the electrode count increases commensurately with the number of qubits and thus, so too does the electronic infrastructure. The generally known solution to this scaling issue is the integration of subsystems into the vacuum/cryogenic environment or more specifically into the trap itself. Broad-scale integration of all electronics systems may not be feasible or necessary but the integration of select ancillary subsystems will be essential in order to meet the requirements for achieving a useful quantum volume.

A relevant example of this scaling issue is the coupling of the surface ion traps to a capacitive filter bank external to the vacuum chamber that serve to limit noise injected by control electronics. Due to this cascade of filter banks the transport sequences of voltages injected on and/or applied to the DC electrodes must be amplified such that some of the higher frequency content, that is attenuated at the filter stage, is exaggerated before the filter and trap stages of the circuit (i.e. "pre-distortion") giving rise to an additional source of noise. Additionally, fixed RF-shunt capacitors, that are currently integrated below the electrode interconnect layers, serve as capacitive dividers to mitigate AC coupling between the RF electrodes and the DC electrodes. This conglomeration of control electronics that interact with the ion trap poses a physical scaling predicament for future ion trap control electronics, if under such configurations.

Based upon this scaling premise, it is the purpose of this disclosure to provide technical solutions for integration of these ancillary electronic systems by means of integration (e.g., monolithic-integration) of switching networks in the ion trap and/or interposer layer(s). Several example subsystems are provided to demonstrate how ion trap-integrated switching coupled with the subsystem enable necessary ion trap functionality while simultaneously reducing the footprint of the electronic infrastructure.

The integrated switching configurations proposed in this disclosure offer a means to aggregate multiple functions into the ion trap chip and provide a scaling path for large qubit count surface ion traps. These functions include the DC shunt capacitor divider, external filter bank, and user-control switching that enables bandwidth tuning and/or DAC-originated noise elimination according to the desired sequence of voltages injected on and/or applied to the DC electrodes. Moreover, the monolithic Silicon MOSFET switch may be utilized as an on-chip amplifier or switch depending on the desired application.

Various embodiments provide technical solutions to the technical problem of providing an ion trap apparatus with a significantly reduced volume of external and/or internal electronic infrastructure systems (e.g., control electronics). By monolithically integrating at least some electronic infrastructure systems within the ion trap apparatus and/package, the footprint of the overall electronic infrastructure systems are greatly reduced. During operations, a typical ion trap apparatus may be located in a cryogenic and/or vacuum chamber while the electronic infrastructure systems are external to the cryogenic and/or vacuum chamber, requiring leads, wires and/or feedthroughs between the ion trap apparatus and the external environment.

An example ion trap apparatus may comprise a plurality of monolithically-integrated switches (e.g., FETs, TSV-FETs, integrated circuits and/or combinations thereof) defining a monolithically-integrated switching apparatus configured to control and/or condition voltage signals applied to the DC electrodes of the ion trap apparatus. The monolithically-integrated solution incorporates portions of the electronic infrastructure systems into the ion trap apparatus, reducing the volume of internal/external hardware and the number of wires and feedthroughs between the cryogenic and/or vacuum chamber and the external environment, while reducing incident noise from electronic infrastructure systems. Additional advantages may be realized with the implementation of the TSV-FET structure, further reducing the footprint of the electronic infrastructure systems. Further, utilizing an optical driver as a control interconnect between the cryogenic and/or vacuum chamber and the external environment further reduces the number of wires being passed through the cryogenic and/or vacuum chamber and incident noise from the electronic infrastructure systems.

The monolithically-integrated solution disclosed herein offers a means to aggregate multiple functions into the ion trap apparatus (e.g., ion trap chip) and provides a scaling path for large qubit count surface traps. These functions include the DC shunt capacitor divider, filter bank, and user-control switching that enable bandwidth tuning and/or DAC-originated noise elimination according to the desired waveform injected on the DC electrodes. Moreover, the monolithically-integrated TSV-FET structures may serve as a building block for the realization of higher-order functions, reducing the overall volume of hardware/electronics within and external to the ion trap apparatus.

Exemplary Controller

In various embodiments, the ion trap apparatus is incorporated into a quantum computer. In various embodiments, a quantum computer further comprises a controller configured to control various elements of the quantum computer. For example, the controller may be configured to control the voltage sources, a cryogenic system and/or vacuum system controlling the temperature and pressure within the cryogenic and/or vacuum chamber, manipulation sources, and/or other systems controlling the environmental conditions (e.g., temperature, humidity, pressure, and/or the like) within the cryogenic and/or vacuum chamber and/or configured to manipulate and/or cause a controlled evolution of quantum states of one or more ions within the surface ion trap.

As shown in FIG. 11, in various embodiments, the controller 30 may comprise various controller elements including processing elements 1105, memory 1110, driver controller elements 1115, a communication interface 1120, analog-digital converter elements 1125, and/or the like. For example, the processing elements 1105 may comprise programmable logic devices (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, other processing devices and/or circuitry, and/or the like. and/or controllers. The term circuitry may refer to an entirely hardware embodiment or a combination of hardware and computer program products. In an example embodiment, the processing element 1105 of the controller 30 comprises a clock and/or is in communication with a clock.

For example, the memory 1110 may comprise non-transitory memory such as volatile and/or non-volatile memory storage. In various embodiments, the memory 1110 may store qubit records corresponding the qubits of quantum computer (e.g., in a qubit record data store, qubit record database, qubit record table, and/or the like), a calibration table, an executable queue, computer program code (e.g., in a one or more computer languages, specialized controller language(s), and/or the like), and/or the like. In an example embodiment, execution of at least a portion of the computer program code stored in the memory 1110 (e.g., by a processing element 1105) causes the controller 30 to perform one or more steps, operations, processes, procedures and/or the like described herein for applying controlled and/or conditioned sequences of voltages to the DC electrodes of the ion trap apparatus.

In various embodiments, the driver controller elements 1115 may include one or more drivers and/or controller elements each configured to control one or more drivers. In various embodiments, the driver controller elements 1115 may comprise drivers and/or driver controllers. For example, the driver controllers may be configured to cause one or more corresponding drivers to be operated in accordance with executable instructions, commands, and/or the like scheduled and executed by the controller 30 (e.g., by the processing element 1105). In various embodiments, the driver controller elements 1115 may enable the controller 30 to operate a manipulation source 60. In various embodiments, the drivers may be laser drivers; vacuum component drivers; drivers for controlling the flow of current and/or voltage applied to DC, RF, and/or other electrodes used for maintaining and/or controlling the ion trapping potential of the surface ion trap 102; drivers for optically and/or electronically controlling one or more switches of an integrated switching apparatus; cryogenic and/or vacuum system component drivers; and/or the like. For example, the drivers may control and/or comprise DC and/or RF voltage drivers and/or voltage sources that provide voltages and/or electrical signals to the DC electrodes 116, and/or lengths of electrodes 112. In various embodiments, the controller 30 comprises means for communicating and/or receiving signals from one or more optical receiver components such as cameras, MEMS cameras, CCD cameras, photodiodes, photomultiplier tubes, and/or the like. For example, the controller 30 may comprise one or more analog-digital converter elements 1125 configured to receive signals from one or more optical receiver components, calibration sensors, and/or the like.

In various embodiments, the controller 30 may comprise a communication interface 1120 for interfacing and/or communicating with a computing entity 10. For example, the controller 30 may comprise a communication interface 1120 for receiving executable instructions, command sets, and/or the like from the computing entity 10 and providing output received from the quantum computer 210 (e.g., from an optical collection system) and/or the result of a processing the output to the computing entity 10. In various embodiments, the computing entity 10 and the controller 30 may communicate via a direct wired and/or wireless connection and/or one or more wired and/or wireless networks 20.

Exemplary Computing Entity

FIG. 12 provides an illustrative schematic representation of an example computing entity 10 that can be used in conjunction with embodiments of the present invention. In various embodiments, a computing entity 10 is configured to allow a user to provide input to the quantum computer 210 (e.g., via a user interface of the computing entity 10) and receive, display, analyze, and/or the like output from the quantum computer 210.

In general, the terms computing entity, computer, entity, device, system, and/or similar words used herein interchangeably may refer to, for example, one or more computers, computing entities, desktops, mobile phones, tablets, phablets, notebooks, laptops, distributed systems, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Such functions, operations, and/or processes may include, for example, transmitting, receiving, operating on, processing, displaying, storing, determining, creating/generating, monitoring, evaluating, comparing, and/or similar terms used herein interchangeably. In one embodiment, these functions, operations, and/or processes can be performed on data, content, information, and/or similar terms used herein interchangeably.

As shown in FIG. 12, the computing entity 10 may also include one or more communications interfaces 1220 for communicating with various computing entities, such as by communicating data, content, information, and/or similar terms used herein interchangeably that can be transmitted, received, operated on, processed, displayed, stored, and/or the like.

In some embodiments, the computing entity 10 may include or be in communication with one or more processing elements 1205 (also referred to as processors, processing circuitry, and/or similar terms used herein interchangeably) that communicate with other elements within the computing entity 10 via a bus, for example. As will be understood, the processing element 1205 may be embodied in a number of different ways.

As will therefore be understood, the processing element 1205 may be configured for a particular use or configured to execute instructions stored in volatile or non-volatile media or otherwise accessible to the processing element 1205. As such, whether configured by hardware or computer program products, or by a combination thereof, the processing element 1205 may be capable of performing steps or operations according to embodiments of the present invention when configured accordingly.

In one embodiment, computing entity 10 may further include or be in communication with non-volatile media (also referred to as non-volatile storage, memory, memory storage, memory circuitry and/or similar terms used herein interchangeably). In one embodiment, the non-volatile storage or memory may include one or more non-volatile storage or memory media 1210. As will be recognized, the non-volatile storage or memory media may store databases, database instances, database management systems, data, applications, programs, program modules, scripts, source code, object code, byte code, compiled code, interpreted code, machine code, executable instructions, and/or the like.

In one embodiment, the computing entity 10 may further include or be in communication with volatile media (also referred to as volatile storage, memory, memory storage, memory circuitry and/or similar terms used herein interchangeably). In one embodiment, the volatile storage or memory may also include one or more volatile storage or memory media 1215. As will be recognized, the volatile storage or memory media may be used to store at least portions of the databases, database instances, database management systems, data, applications, programs, program modules, scripts, source code, object code, byte code, compiled code, interpreted code, machine code, executable instructions, and/or the like being executed by, for example, the processing element 1205. Thus, the databases, database instances, database management systems, data, applications, programs, program modules, scripts, source code, object code, byte code, compiled code, interpreted code, machine code, executable instructions, and/or the like may be used to control certain aspects of the operation of the computing entity 10 with the assistance of the processing element 1205 and operating system.

As indicated, in one embodiment, the computing entity 10 may also include one or more communications interfaces for communicating with various computing entities, such as by communicating data, content, information, and/or similar terms used herein interchangeably that can be transmitted, received, operated on, processed, displayed, stored, and/or the like. Similarly, the computing entity 10 may be configured to communicate via wireless client communication networks using any of a variety of protocols.

Although not shown, the computing entity 10 may include or be in communication with one or more input elements, such as a keyboard input, a mouse input, a touch screen/display input, motion input, movement input, audio input, pointing device input, joystick input, keypad input, and/or the like. The computing entity 10 may also include or be in communication with one or more output elements (not shown), such as audio output, video output, screen/display output, motion output, movement output, and/or the like.

Conclusion

Many modifications and other embodiments of the invention set forth herein will come to mind to one skilled in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An ion trap chip comprising:
a surface ion trap chip having a plurality of electrodes,
a plurality of interconnect layers;
a substrate; and
at least one integrated switching network layer disposed between the plurality of interconnect layers and the substrate, the integrated switching network layer comprising a plurality of monolithically-integrated controls and/or switches configured to condition a voltage signal applied to at least one of the plurality of electrodes.

2. The ion trap chip of claim 1, wherein ion trap chip is configured to operate within a cryogenic chamber.

3. The ion trap chip of claim 1, wherein at least some of the plurality of monolithically-integrated controls and/or switches comprise one or more of bipolar junction transistors, metal-oxide-semiconductor field effect transistors, metal-semiconductor field-effect transistors, junction gate field-effect transistors, heterojunction bipolar transistors, high-electron-mobility transistors, field-effect transistors and through-silicon-via field effect transistors and through-silicon-capacitors.

4. The ion trap chip of claim 3, wherein at least some of the plurality of monolithically-integrated controls and/or switches comprise through-silicon-via field effect transistors configured as through-silicon-capacitors.

5. The ion trap chip of claim 3, wherein at least some of the plurality of monolithically-integrated controls and/or switches comprise through-silicon-via field effect transistors configured as one or more of voltage-out-of-range switches and disconnect switches.

6. The ion trap chip of claim 1, wherein the plurality of monolithically-integrated controls and/or switches comprises at least one optically driven switch.

7. An ion trap apparatus comprising:
an ion trap chip having a plurality of electrodes;
an interposer chip coupled to the ion trap chip; and
at least one integrated switching network layer, the integrated switching network layer comprising a plurality of monolithically-integrated controls and/or switches configured to condition a voltage signal applied to at least one of the plurality of electrodes,
wherein the interposer chip defines at least a first portion of the at least one integrated switching network layer.

8. The ion trap apparatus of claim 7, wherein the ion trap chip comprises a surface ion trap chip.

9. The ion trap apparatus of claim 7, wherein the ion trap apparatus is configured to operate within a cryogenic chamber.

10. The ion trap apparatus of claim 7, wherein at least some of the plurality of monolithically-integrated controls and/or switches comprise one or more of bipolar junction transistors, metal-oxide-semiconductor field effect transistors, metal-semiconductor field-effect transistors, junction gate field-effect transistors, heterojunction bipolar transistors, high-electron-mobility transistors, field-effect transistors, through-silicon-via field effect transistors and through-silicon-capacitors.

11. The ion trap apparatus of claim 10, wherein at least some of the plurality of monolithically-integrated controls and/or switches comprise through-silicon-via field effect transistors configured as through-silicon-capacitors.

12. The ion trap apparatus of claim 10, wherein at least some of the plurality of monolithically-integrated controls and/or switches comprise through-silicon-via field effect transistors configured as one or more of voltage-out-of-range switches and disconnect switches.

13. The ion trap apparatus of claim 7, wherein the plurality of monolithically-integrated controls and/or switches comprises at least one optically driven switch.

14. The ion trap apparatus of claim 7, further comprising an integrated switching network chip coupled and/or connected to the ion trap chip and interposer chip assembly, the integrated switching network chip comprising at least a second portion of the at least one integrated switching network layer.

15. An ion trap apparatus comprising:
an ion trap chip having a plurality of electrodes;
an interposer chip assembly coupled to the ion trap chip;
at least one integrated switching network layer coupled to the ion trap chip and interposer chip assembly; and
an integrated switching network chip coupled and/or connected to the ion trap chip and interposer chip assembly, consisting of the at least one integrated switching network layer which comprises a plurality of monolithically-integrated controls and/or switches configured to condition a voltage signal applied to at least one of the plurality of electrodes.

16. The ion trap apparatus of claim 15, wherein the integrated switching network chip is coupled to the ion trap and interposer chip assembly via one or more of bonding, fastening, attachment or co-fabrication.

17. The ion trap apparatus of claim 15, wherein the integrated switching network chip is connected to the ion trap and interposer chip assembly via an interconnect.

18. The ion trap apparatus of claim 15, wherein the ion trap chip comprises a surface ion trap chip.

19. The ion trap apparatus of claim 15, wherein the ion trap apparatus is configured to operate within a cryogenic chamber.

20. The ion trap apparatus of claim 15, wherein at least some of the plurality of monolithically-integrated controls and/or switches comprise one or more of bipolar junction transistors, metal-oxide-semiconductor field effect transistors, metal-semiconductor field-effect transistors, junction gate field-effect transistors, heterojunction bipolar transistors, high-electron-mobility transistors, field-effect transistors, through-silicon-via field effect transistors and through-silicon-capacitors.

21. The ion trap apparatus of claim 20, wherein at least some of the plurality of monolithically-integrated controls and/or switches comprise through-silicon-via field effect transistors configured as through-silicon-capacitors.

22. The ion trap apparatus of claim 15, wherein the plurality of monolithically-integrated controls and/or switches comprises at least one optically driven switch.

* * * * *